United States Patent
Ashjaee

(12) 
(10) Patent No.: US 6,732,129 B1
(45) Date of Patent: May 4, 2004

(54) ADAPTIVE FILTERING AND LEARNING SYSTEM HAVING INCREASED CONVERGENCE SPEED AND STABILITY

(76) Inventor: Spanta J. Ashjaee, 10046 Crescent Rd., Cupertino, CA (US) 95014-1012

(*) Notice: Subject to any disclaimer, the term of this patent is extended or adjusted under 35 U.S.C. 154(b) by 542 days.

(21) Appl. No.: 09/678,668

(22) Filed: Oct. 4, 2000

(51) Int. Cl.[7] ............................................. G06F 17/10
(52) U.S. Cl. ........................................................ 708/322
(58) Field of Search .................................. 708/322–323

(56) References Cited

U.S. PATENT DOCUMENTS 4,349,889 A  9/1982  van den Elzen et al. ... 364/724
4,791,390 A  12/1988  Harris et al. ................. 333/166

Primary Examiner—Tan V. Mai
(74) Attorney, Agent, or Firm—Crowell & Moring LLP

(57) ABSTRACT

The rate of convergence of an adaptive system is optimized as a function of the stability with which it converges to a desired state. In the adaptive technique according to the invention, for optimal convergence, a large adaptive coefficient value is used in stable regions with relatively smaller noise, while a smaller adaptive coefficient is used in unstable or noisy environments. Also when the solution has been reached $\mu$ is decreased to decrease the effects of noise and the residual error. Various algorithms are used to evaluate the stability with which the system converges and to select a corresponding adaptive coefficient. The method and apparatus according to the invention provides an optimum rate of convergence based on the overall stability of the system, while minimizing the residual error.

49 Claims, 19 Drawing Sheets

ADAPTIVE FILTERING AND LEARNING SYSTEM HAVING INCREASED CONVERGENCE SPEED AND STABILITY

The present invention is directed to a method and apparatus for adaptive filtering or "learning", which increases both the stability and the rate of convergence of the system, while decreasing its residual error. For an adaptive filter, the adaptive coefficient is variable to produce a more efficient adaptation of the "weights". The method and apparatus according to the invention can be used in conjunction with known adaptive filtering techniques and devices, using for example the LMS algorithm, or any other technique such as Newton, Steepest-Descent, SHARF, SER, random search, LMS-Newton, RLS, Widrow, Griffith's LMS, which are known to those skilled in the art.

BACKGROUND OF THE INVENTION

Adaptive systems are systems that can adapt to changing environments or changing system requirements, self-optimize, self-design, self-train, repair themselves, and adapt around internal defects, by adjustment of system parameters or so-called "weights" W which determine a transfer function of the filter. Adaptive filtering and learning techniques are used in a variety of applications, such as signal processing, communications, numerical analysis, instrumentation and measurement, analog/digital conversion, digital filtering, radar, sonar, seismology, mechanical design, navigation systems, biomedical electronics, echo canceling, predictors, inverse modeling, deconvolution, equalization, inverse filtering, adaptive control systems, adaptive arrays, feedforward and feedback systems (open and closed loop systems), prediction, system identification (modeling), cellular or wireless products, interference canceling, signal canceling, to determine solutions to sets of equations, etc.

In adaptive filtering or learning techniques, the adaption process utilizes the following generic algorithm (for systems having one weight):

$$W_{k+1} = W_k + \mu(-\nabla_k)$$

where $W_k$ is the value of the weight at time k; $\mu$ is the adaptive coefficient; and $-\nabla_k$ is the gradient or direction to adapt (having both magnitude and direction), which can also be an approximation.

For systems having multiple weights (that is, systems which are designed to emulate processes or phenomena which are characterized by more than one parameter):

$$W_{k+1} = W_k + \mu(-\nabla_k)$$

where $W_k$ is a vector of the weight values at time k; $\mu$ in this case is a vector (i.e., each weight has its own adaptive coefficient); and $-\nabla_k$ is the gradient vector or direction to adapt, as described above.

It is known that the adaptive coefficient $\mu$ has the following influences:

A small $\mu$ translates into a slow, stable convergence, with a smaller effect due to noise, and also has a small residual error.

A larger $\mu$ converges more quickly, but is less stable, and noise becomes more of a factor.

Accordingly, it is advantageous to vary the value of $\mu$ which is used in the above generic adaptive filtering algorithm in a manner which improves the convergence rate and stability while decreasing the residual error in the system output, even in the presence of significant noise. Adaptive filtration techniques which vary the adaptive coefficient for this purpose are known. For example, U.S. Pat. No. 4,791,390 discloses an adaptive filter in which a variable scale factor is chosen for each iteration of an adaptive process, based on sign changes in the incremental weight changes. Similarly, U.S. Pat. No. 4,349,889 discloses a non-recursive filtering technique in which a sequence of delayed versions of the input signal are weighted using a sequence of coefficients which are each adjusted iteratively by positive and negative correction steps. Larger or smaller step sizes are implemented depending on the number of preceding correction steps for which the sign is unchanged.

The filtering arrangements disclosed in the '390 and '889 patents both achieve enhanced convergence relative to systems in which the scale factor or adaptive coefficients are fixed. However, each of these systems is limited in that the change of the scale factor is based solely on evaluation of the sign of each step in the process. Thus, in neither device or technique is the overall stability of the convergence of the system fully taken into account. Accordingly, neither attempts to maintain stability when speeding convergence. Moreover, in diverging cases, the divergence may actually occur much more quickly.

It is therefore an object of the preset invention to provide an improved adaptive filtering method and apparatus in which the convergence speed and residual error values are enhanced by taking into account indicia of the convergence stability of the system. The present invention considers the spatial vector of each step, rather then just its sign.

SUMMARY OF THE INVENTION

In the adaptive filtering or learning system according to the present invention, convergence of the system is optimized by taking into account the stability with which it converges to a desired state. That is, in the adaptive technique according to the invention, for optimal convergence, a large $\mu$ value is used in stable regions with relatively smaller noise, as determined by the criteria described in detail hereinafter. On the other hand, a smaller $\mu$ is used in unstable or noisy environments. Also when the solution has been reached (that is, the system has converged), $\mu$ is decreased to decrease the effects of noise and the residual error.

Therefore, the method and apparatus according to the invention provides an optimum rate of convergence based on the overall stability of the system, while minimizing the residual error. This method becomes very valuable in non-steady state conditions because the variable adaptive filter will allow the weights to behave appropriately when conditions are changing. The weights will adapt towards the solution and "settle" at the solution until conditions change, then the weights will adapt to the new environment.

For a better understanding of the explanation which follows, the following definitions are provided:

Stable convergence refers to a convergence path that is transcending in a stable manner, based on criteria which may be specified, for example, in terms of the time variation or "curvature" of the step size in the weights, or in other manners, as described hereinafter. FIG. 2 is an example of stable convergence.

Unstable convergence refers to a convergence path that is transcending in an unstable manner, based on criteria described herein. The latter may also be specified in terms of the curvature of the step size in the weights or in other manners. FIG. 3 shows an example of unstable convergence.

Noisy Solution is a solution which exhibits "jitter" or oscillation of the weights around the solution due to noise when the weights have reached convergence, leading to residual error. FIG. 4 is an example of a noisy solution.

Spacing means the amount of space between points used to determine if the weights are transcending in a stable or unstable manner, as shown in FIG. 5.

Detail refers to the number of points used to determine the stability of the convergence path of the weights; it is thus a measure of how detailed the curve will be; this term is also used herein to refer to the individual data points themselves. See FIG. 6.

Stability Level is a measure of how stable or unstable the convergence path is, determined as described hereinafter.

In the method and apparatus according to the invention, the adaptive coefficient $\mu$ is increased, decreased, or kept constant (in a manner described in detail hereinafter), depending on certain criteria as to whether the values of W are stable or unstable. It should be noted in this regard that although the algorithm discussed herein is presented as dependent upon the values of the weights (W) or its increments, the same effect may be derived using the values of the gradient ($-\nabla_k$) or an estimate of it. Also, the error (or any other signal used to estimate the gradient) may also be used to implement the same algorithm.

An example of a Rapid and More Stable ("RAMS") algorithm which is used in the adaptive filtering or learning system according to the invention is as follows:

In the case of unstable convergence (or reached solution), decrease $\mu$ (but not below $\mu_{min}$).

In the case of stable convergence, increase $\mu$ (but not above $\mu_{max}$)

In all other cases, do not change $\mu$.

Such an increase/decrease in $\mu$ as provided in this algorithm may be by a constant size, a constant scalar, a variable size, a variable scalar, or chosen from a predetermined set of values, and can vary upon different conditions or regions, as explained in greater detail hereinafter. It should also be noted that $\mu_{max}$ and $\mu_{min}$ are optional, and need not be specified.

The RAMS algorithm, it should be noted, is expandable to take into account more regions than just "unstable" and "stable" referred to above. For example, it may include additional regions, such as "very stable", "very unstable", etc. Moreover, the stability regions as such (stable, unstable, etc.) may be replaced by a continuous or analog set of stability measures, to supply a continuous or analog set of changes to $\mu$. Also, the order in which the system is tested against the criteria for stable, unstable, etc. can be changed.

The RAMS algorithm may be used with any adapting or varying weights or parameters, including feedforward and feedback weights, and may also be used with Finite Impulse Response ("FIR") and Infinite Impulse Response ("IIR") filters.

Other objects, advantages and novel features of the present invention will become apparent from the following detailed description of the invention when considered in conjunction with the accompanying drawings.

DETAILED DESCRIPTION OF THE DRAWINGS

Figure 1A:
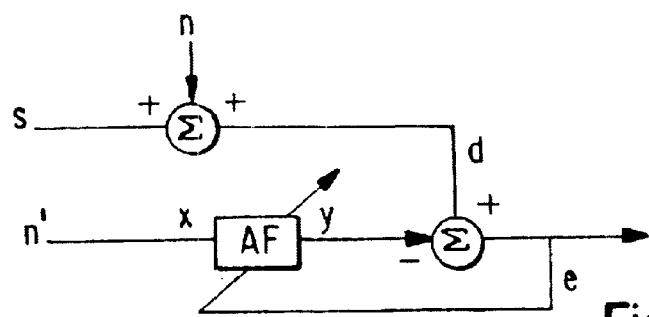
FIGS. 1.a–1.d are schematic diagrams which explain certain known applications for adaptive filters.
Figure 1B:
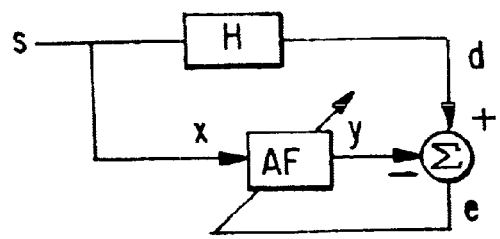
Figure 1C:
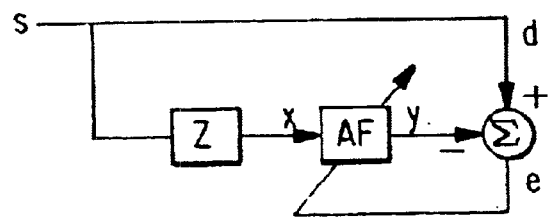
Figure 1D:
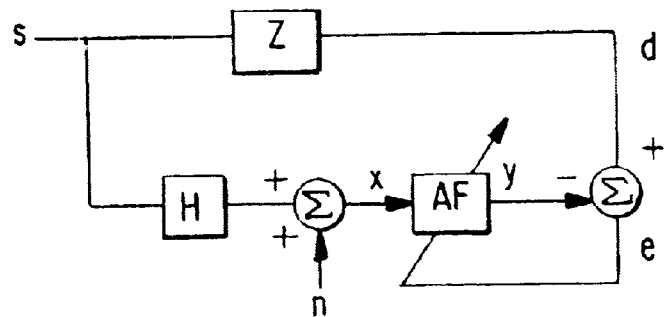
Figure 2:
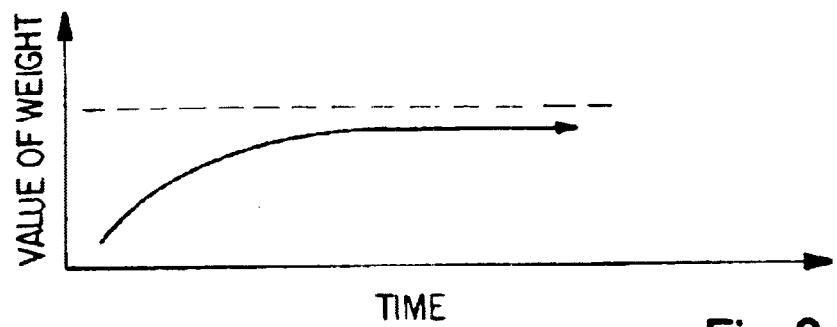
FIG. 2 is a graphic illustration of stable convergence.
Figure 3:
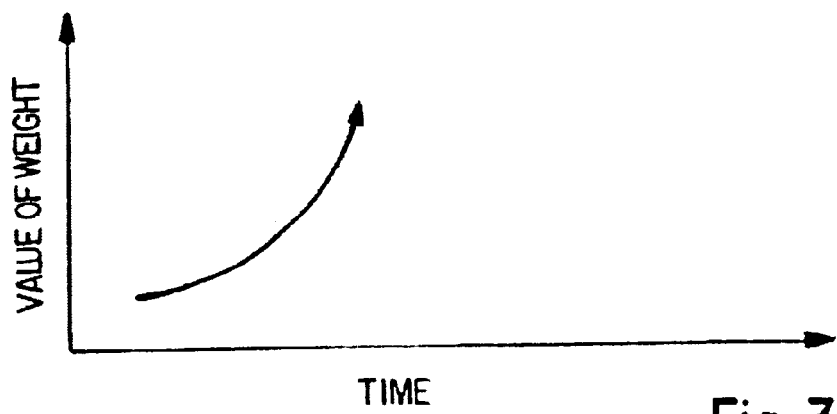
FIG. 3 is a graphic illustration of unstable convergence.
Figure 4:
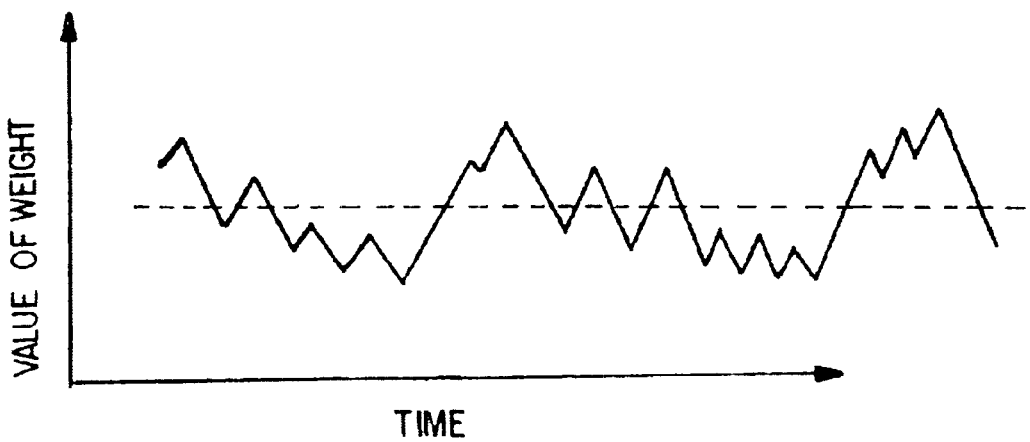
FIG. 4 is a graphic illustration of a noisy convergence.
Figure 5:
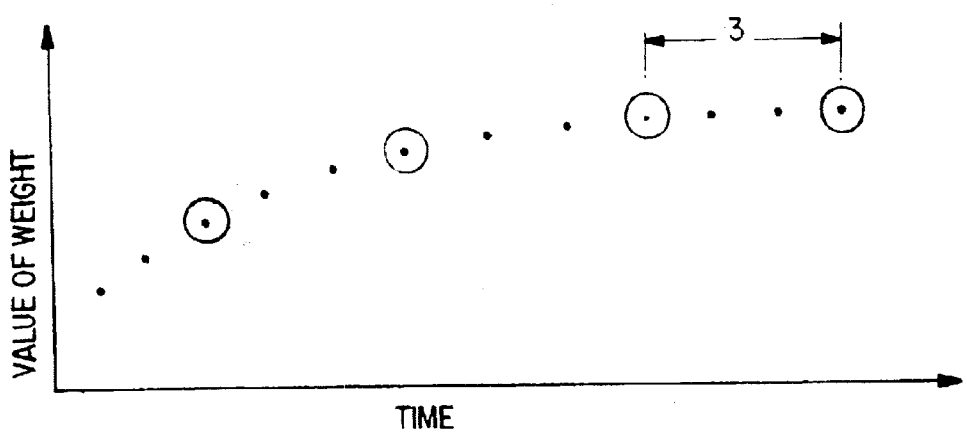
FIG. 5 is an illustration which explains the spacing of details.
Figure 6:
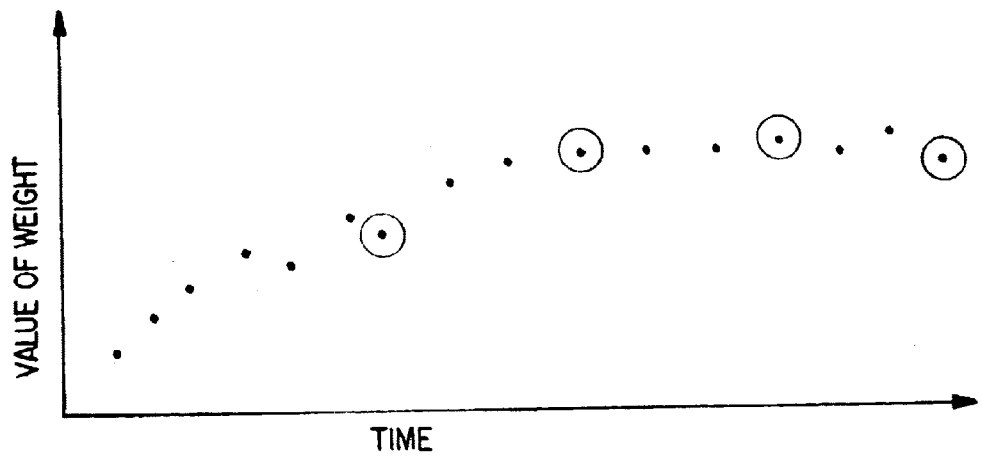
FIG. 6 illustrates an example of the meaning of details.

FIGS. 1.a–1.d are schematic diagrams which illustrate the operation of known applications of conventional adaptive filtering techniques, using the components shown in FIG. 1.d. In such application, the desired signal, d, is the quantity the adaptive filter is endeavoring to duplicate; that is, the filter minimizes the error (difference) between the output of the adaptive filter, y, and the desired signal, d.

FIG. 1.a Noise Cancellation. A signal s is corrupted with noise n. n' is a signal which is correlated with n. It is desired to run n' through the adaptive filter to make it most similar to the signal d (d=s+n). Since n' is correlated with n, and is not correlated with s, the output of the adaptive filter would be similar to n and can cancel the noise n.

FIG. 1.b Modeling. The signal s is the input to a channel H and to the adaptive filter. Now the adaptive filter models itself as the channel H so that the output of the adaptive filter, y, is similar to the output of the channel, d. When the error is minimized between y and d, the adaptive filter is said to be a model of the channel.

FIG 1.c Predictors. The signal is sent through a delay and through the adaptive filter, which adapts itself so that its output is the most similar to the undelayed signal. Therefore, the adaptive filter predicts the signal from previous samples.

FIG 1.d Equalization. For equalization, the adaptive filter seeks to output a delayed version of the signal. Its input is assumed to be an altered version of the signal (due to a channel) and also been corrupted by noise. The delay is meant to allow for the propagation time through the channel and the adaptive filter.

In each of the above systems, the rate of convergence—that is, the speed with which the system settles at a desired state, such as effective noise cancellation, modeling the properties of an emulated process, etc.—can be enhanced by varying the adaptive coefficient $\mu$, based on the overall stability of the system convergence, without sacrificing the quality of the response. In the following explanation, various criteria are provided for determining the convergence status of the system—that is, whether it is unstable or stable, or whether convergence has been reached. Criteria for assigning a "stability level" are also assigned. Finally, techniques for setting a change in $\mu$ values are also discussed.

It should be noted that the criteria used in the respective categories or regions may overlap, be mutually exclusive, or exhibit gaps, and may be selected from among many options. Also, more than one method or criterion may be used for implementing each of these determinations. If a combination of methods is used, the requirement may be, for example that p out of q "flags" or methods test positive in a confirmation for the algorithm. Other methods of combining multiple methods may also be used, as illustrated hereinafter.

In the discussion contained in the following sections, the inequalities (such as A>kB) assume that the step direction of B is seen as the "positive" direction, i.e., greater than zero. This is regardless of the fact that the weight may be increasing or decreasing in value. Also note that A<kB for a negative k refers to |A|>|kB| and A is in the opposite direction of B.

Methods of Determining Unstable Convergence

Figure 7:
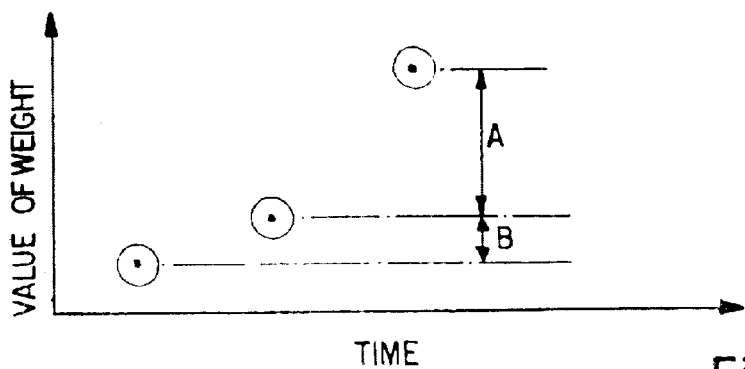
FIGS. 7 and 8 are examples of unstable convergence using three and six details, respectively.
Figure 8:
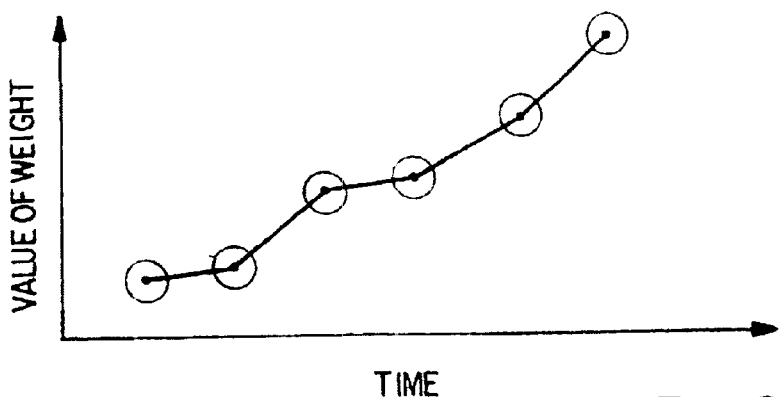

One criterion of determining instability of convergence is that the step sizes (that is, the change between consecutive details) are increasing. For a method using three details, this would mean that A>kB, for some value k, as shown in FIG. 7. For the analysis of a greater number of points, a system can be determined to be unstable when a certain number or percentage of the steps are larger than the previous ones or greater by a factor of k. The value of k need not be uniform between details and may vary with time or the environment; it may also be different for different criteria being evaluated. Finally, the number of details used for this analysis, and the spacing between points, may vary with time, with the criteria being tested, or with properties of the environment or filter, and does not need to be uniform. FIG. 8 is an example of a system using six details. (Three of the steps are unstable increments.) For this example, if the requirement is that three or more unstable steps out of the five steps would constitute instability, then the system in FIG. 8 would be considered unstable.

A system may also be deemed unstable if a step size is too large, indicating a large error or steep gradient. this may be determined, for example, by whether one of the previous X steps is larger than an amount g. Alternatively, convergence is unstable if the previous X steps have a total or average that is larger than an amount G.

Noise can also create an unstable environment when adapting the weights. A noisy environment may be detected in the above manner, by changes in direction of the steps or by a negative k factor. If k is 0, then any change in direction would suffice.

Figure 9:
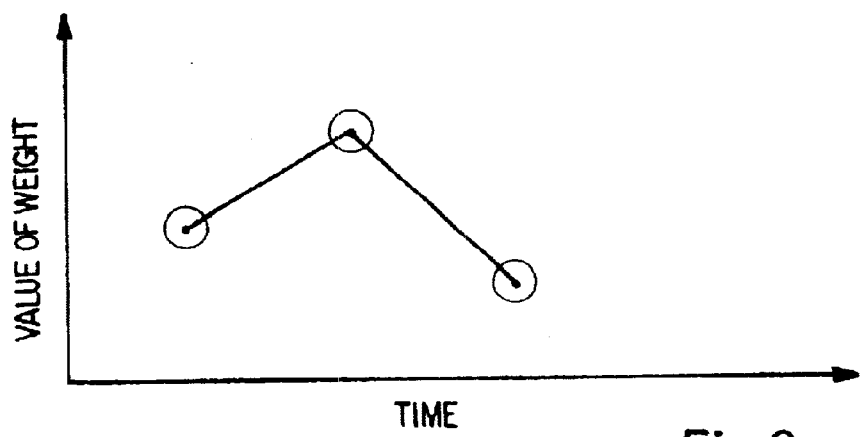
FIGS. 9 and 10 illustrate the criteria for detection of noise, using three and six details, respectively.
Figure 10:
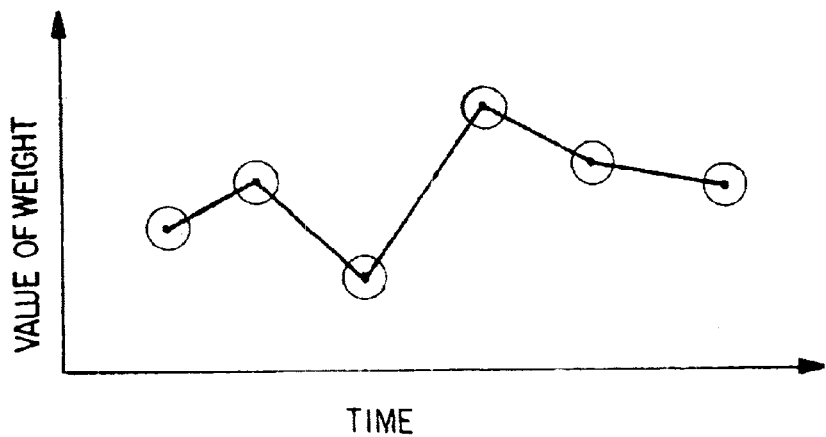

FIG. 9 is an illustration of a change in direction for a system using three details in the curve, while FIG. 10 shows a system using six details with three changes in direction. The number of changes in direction, where A<kB, may be used as a criterion for determining how much to change $\mu$.

Methods of Determining Stable Convergence

Figure 11:
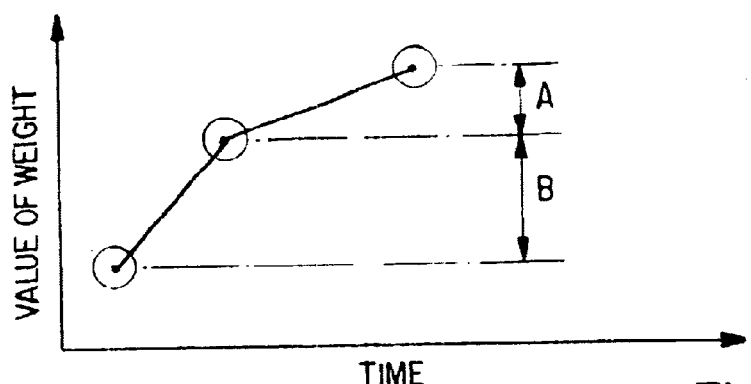
FIGS. 11–13 depict stable convergence using three, five, and six details, respectively.
Figure 12:
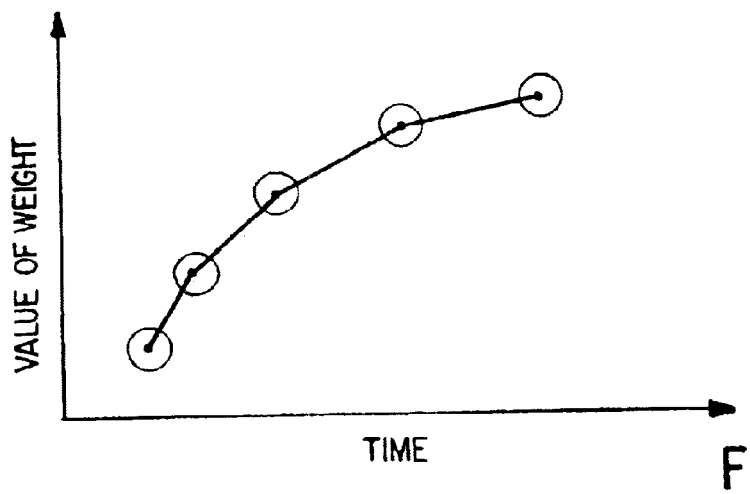
Figure 13:
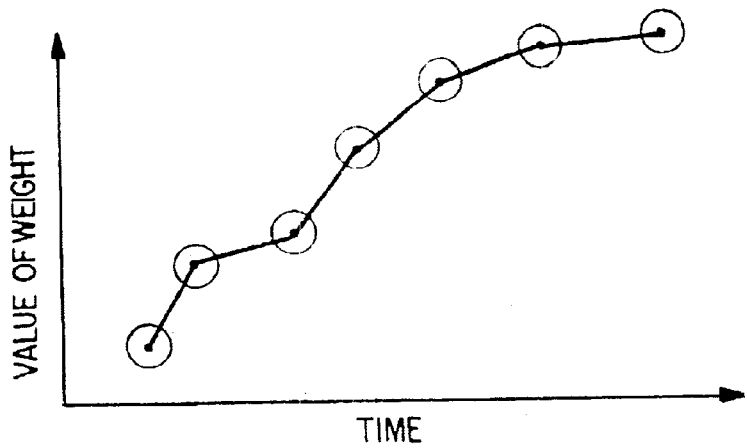

Decreasing step sizes (or not increasing by more than a certain k factors: both positive and negative k may be used) is one criterion for determining the existence of stable convergence. For systems in which more than three details are analyzed, a requirement that a percentage of steps be in the stable region with respect to their previous details may be used. The spacing, details, and value of k do not need to be uniform or symmetric. FIGS. 11–13 are examples showing the analysis of three details, five details, and seven details, respectively. In these examples, the stable region is between k 0 and k=1. Both values can be varied, such as between k=−0.5 and k=1.5.

Another example of a criterion for stable convergence is that no large step sizes occur. For example, this can be determined by requiring that no steps with a magnitude greater than an amount g have occurred in the previous X steps. Alternatively, the average or total of the previous X steps must not be greater than an amount G.

Methods of Determining a Stability Level

Figure 14:
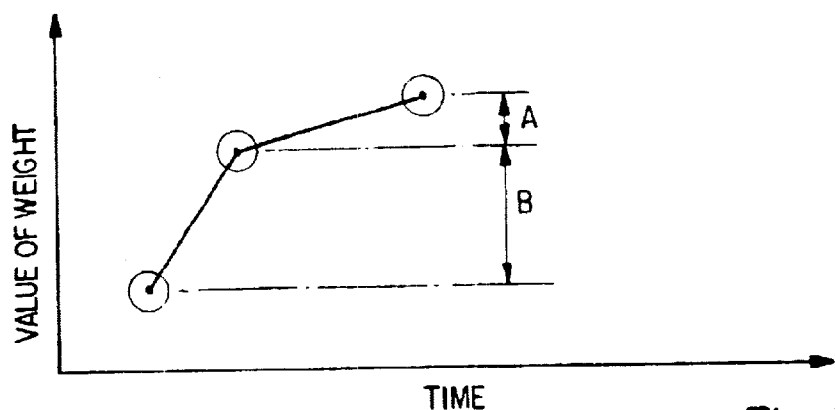
FIGS. 14–16 are examples which illustrate the application of one criterion for determining stability and instability.
Figure 15:
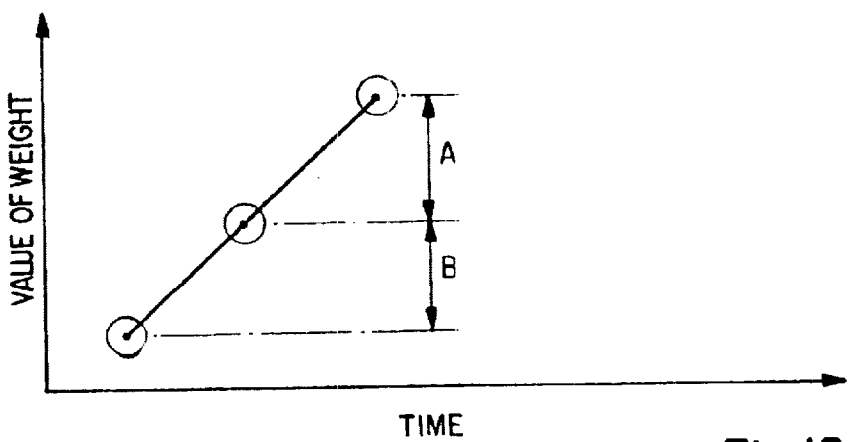
Figure 16:
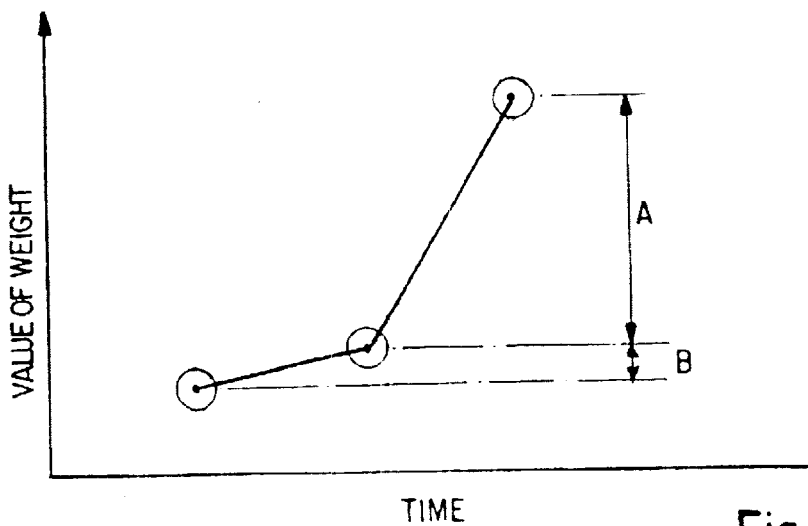

One method of determining the stability level is to look at the factor k that results from the equation A=kB, A and B being the magnitude and direction of consecutive steps. (A change in direction would result in a negative k.) In this case, k may be regarded as a measure of instability (or stability). FIGS. 14–16 are examples of systems which are evaluated as very stable, stable, and very unstable, respectively.

Figure 17:
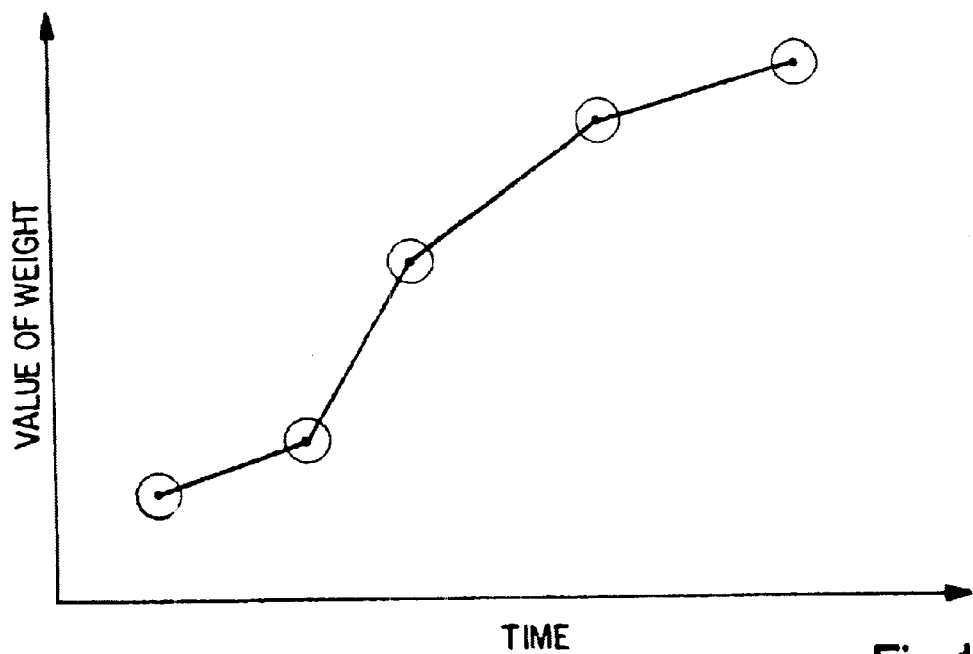
FIGS. 17 and 18 are examples of mostly stable and mostly unstable convergence, respectively.
Figure 18:
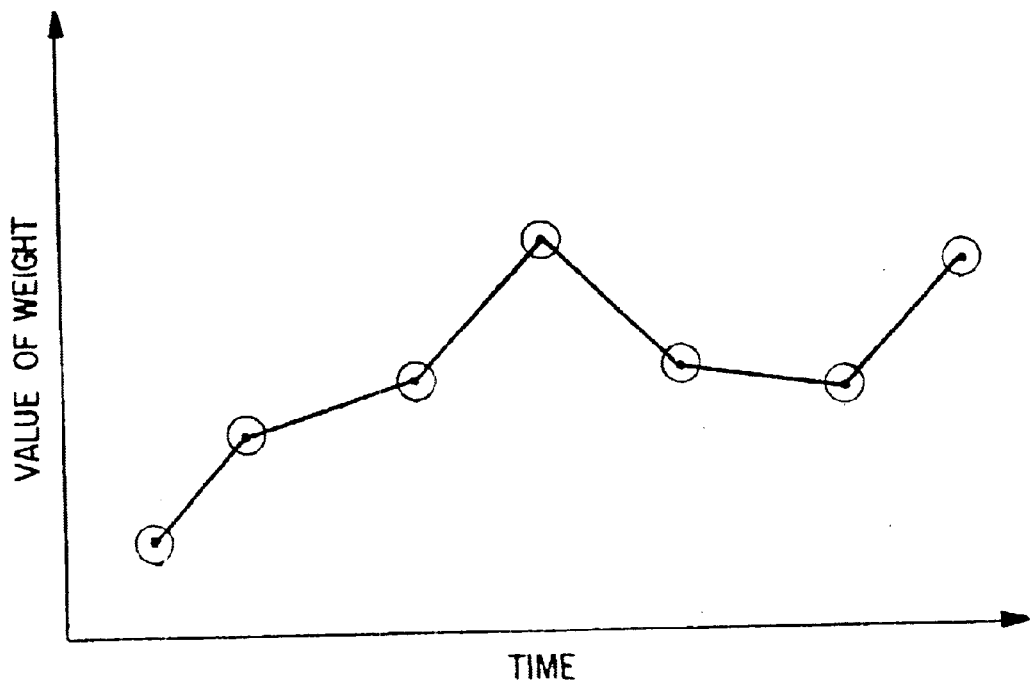

Another criterion which may be used for classifying stability is the percentage of the steps, among the previous X steps, which meet the criterion of being stable (or unstable) with respect to their previous steps. FIG. 17 is an example of mostly stable convergence, while FIG. 18 depicts a mostly unstable convergence, where stability is classified between k=0 and k=1 for these figures.

Another method of determining the stability level may be based on the sum (or average) of the step sizes of the previous X steps, or on the maximum or median step size in the last X steps.

Finally, still another method of determining stability level is to measure the number of sign changes which occur by a value greater than k in a given number of details.

Methods of Determining that Convergence has been Reached

Figure 19:
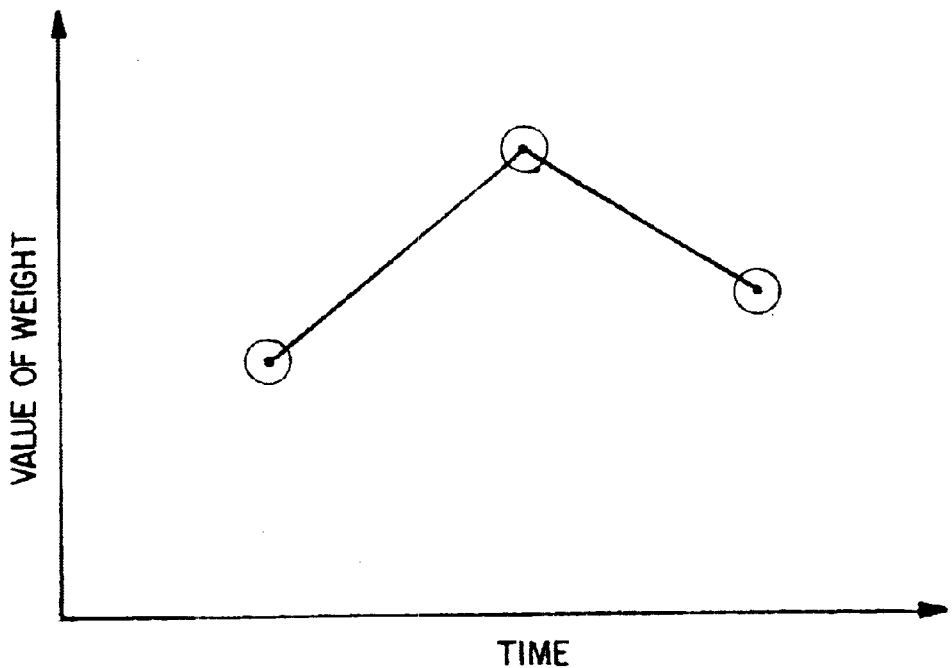
FIGS. 19 and 20 are examples which illustrate sign changes during the convergence of the weights.

The occurrence of a change in direction by a negative value of k or greater (or between specified k values) in the details is a good sign that a "solution" or convergence has been reached. See FIG. 19. (It should be noted in this regard that much the same criterion can be used to determine the existence of noise. A distinction between noise and system convergence can be made by examining the history of the weights or parameters. However, since the action taken (reducing $\mu$) is the same in both cases, it is unnecessary to make such a distinction.)

Figure 20:
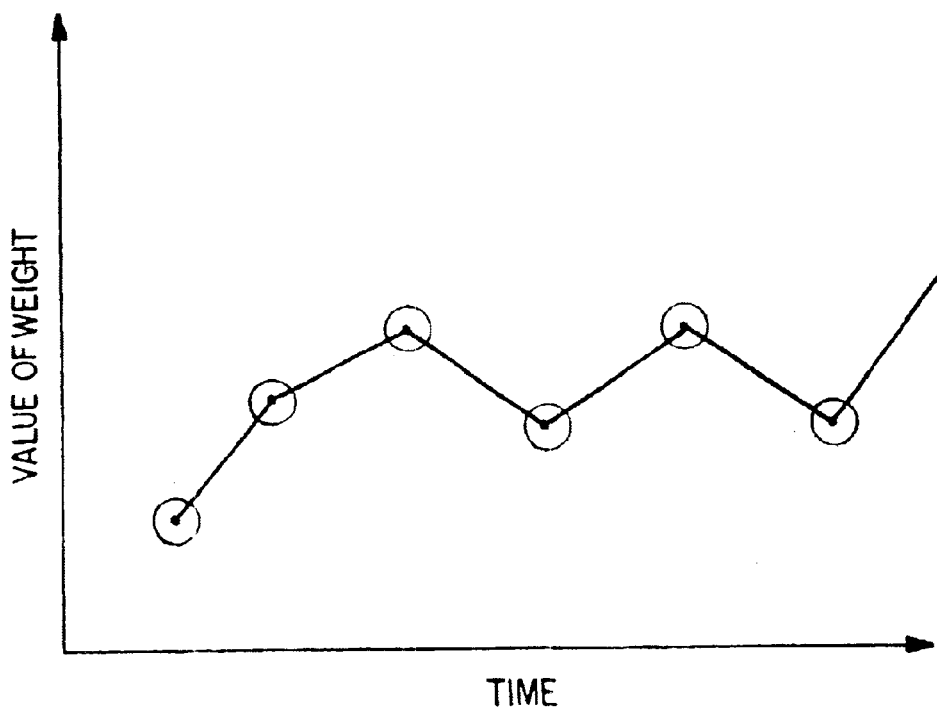

Another method for determining whether convergence has been achieved is to measure how many changes in direction by a value k or greater occur in a curve using more details, as shown in FIG. 20 for k=0.

Yet another method is to require that there be no large step sizes in the last X steps. This may be monitored by the average or sum of the previous X steps, or by requiring that no steps larger than g have occurred in the last X steps.

Another method is to use the data of the recent past and determine the percentage of steps that are positive versus negative. A ratio close to 1 would be a good indication of convergence.

Another method is to measure the range $\in$ within which the weights have remained in the recent past.

Criteria for Updating $\mu$

The criteria to update $\mu$, the adaptive coefficient, may include the requirement that the same conclusion must be reached a preset number of times to cause a modification of the value of $\mu$. For example, two iterations in a row must be categorized as unstable to decrease $\mu$, or two stable iterations in a row may be required to increase $\mu$. This criteria does not need to be symmetric, however; that is, two iterations in a row may be required to be rated as unstable to decrease $\mu$, while three stable iterations in a row are required to increase $\mu$.

Another method may require that p out of the previous q iterations need to be the same to take action. For example, if three of the previous four iterations match then action is taken. Thus, concurrence of three unstable conclusions in the previous four iterations would result in decreasing $\mu$. If three out of the previous 4 iterations do not match, then no action is taken.

Again this method need not be symmetric. It may be required, for example, that all of the previous four iterations need to be stable to increase $\mu$, but only three out of the previous four need to be unstable to decrease $\mu$.

Finally, according to another method, if there is no match, then $\mu$ may still be updated. For example, if three out of the previous four iterations do not match, $\mu$ is increased slightly.

Methods of Increasing or Decreasing $\mu$

One method of changing $\mu$ is to multiply it by a factor greater than one to increase it, and less than one to decrease it. These two factors do not necessarily need to have any correlation.

Another method is to add or subtract a specified amount to $\mu$. (The amount that is added and the amount subtracted need not be the same.) Note that for addition and subtraction it becomes important to prevent $\mu$ from becoming less than zero, such as by specifying $\mu_{min}$.

A third method is to multiply $\mu$ by a variable factor which is greater or less than one, the magnitude of the factor depending on how stable or unstable the system is determined to be. Determination of the stability level may be by the method described in determining stability level or by any other method. The variable factor may have any desired dependence on the stability level. For example, it may be dependent upon categories, such as very highly stable, highly stable, stable, slightly unstable, and very unstable, each category having its own factor associated with it to multiply with $\mu$. Alternatively, the percentage of stable or unstable steps, k-factor of stability, or any other measure can be used to select $\mu$ or be used as a factor in the variable used to modify $\mu$, according to a desired characteristic or equation. For example:

$\mu(k+1)=\mu(k)+f^*(1-|k|)$, where $f$ is a constant factor and $k$ is the k-factor;

$\mu(k+1)=\mu(k)+f^*(1-|k|)^{1/2}$;

$\mu(k+1)=\mu(k)/|k|; \mu(k+1)=\mu(k)/(0.8+|k-0.1|)^{1/3}; \mu(k+1)=\mu(k)/k^2$;

$\mu(k+1)=\mu(k)+f^*P$, where $P$ is the percentage of steps that are stable;

or $\mu(k+1)=\mu(k)^*f^*P$.

The number of changes in direction can also be used as a measure of how sure the algorithm is of reaching a solution, and can be used as a factor to see how much of a change to use for $\mu$.

A fourth method is similar to the third method, except that the variable is added to or subtracted from $\mu$. Once again, it is important to limit $\mu$ from becoming less than zero, such as by specifying $\mu_{min}$.

A fifth method is to provide a set number of values for $\mu$ which can be selected directly, based on the stability or stability region of the system. For example, if the system is categorized into three regions (highly stable, stable, and unstable), each region can have a corresponding value of $\mu$.

A sixth method is to provide a set of $\mu$ values, and increase to the next greater $\mu$ or decrease to the next lower $\mu$, if the system is stable, or, if unstable. If already at the highest (or lowest) $\mu$, then an increase (or decrease) is not made. For cases with more stability regions (such as a highly stable region), $\mu$ can be increased by two values if the system is determined to be highly stable, for example, as opposed to an increase by one value if the system is categorized as stable.

A seventh method is to take into account those changes which have been made to $\mu$ in the recent past. For example, if the previous X iterations have each decreased $\mu$, and the next iteration requires a decrease, then the amount of the decrease can be greater. This method can be used for the case where at least y of the previous X iterations have each decreased, and in the next z iterations if a decrease is needed, the decrease would be by a greater amount. (Or alternatively, a decrease will be implemented regardless, or a different set of conditions can be used to determine if a change on $\mu$ is necessary, and by how much.) For example, if $\mu_{k+1}=0.9f\mu_k$, $\mu_{k+1}$ is altered by a factor of 0.9f rather than f. The f in the 0.9f may be determined in the normal manner. The same method may be applied to increasing $\mu$.

A maximum or minimum step size may also be implemented. For example, a maximum step size would place a ceiling on how large any individual step (or series of steps) can be. The step would be made in the same direction, but the magnitude would be limited. On the other hand, a minimum step size would mean that any step (or series of) must be at least a certain size. In this case, a step would be made in the desired direction, but the magnitude would be increased to the minimum step size.

Another method is to use a constant step size in the direction that is desired. This step size can change with time and/or the characteristics of the environment (such as due to change in direction or steps in the same direction).

Finally, another method of varying the adaptive coefficient is by using the input correlation matrix, R:

$R=E[\bar{X}_k{}^*\bar{X}_k{}^t]$ where $\bar{X}_k=[x_1(k)x_2(k) \ldots x_L(k)]$.

If there is feedback, as well, then let $R=E\{[\overline{X}_k \ \overline{Y}_k]^*[\overline{X}_k \ \overline{Y}_k]^T\}$.
where $[\overline{X}_k \ \overline{Y}_k]$ is one vector.

Determine the eigenvalues ($\lambda$) of R or an estimate of them.

In general cases, select a value of $\mu$ which is a portion of $1/\lambda_{max}$, such as $\mu=1/(2^*\lambda_{max})$, because stability is maintained when $0<\mu<1/\lambda_{max}$. In general, the following conditions on $\mu$ have different effects on the convergence.

| | |
|---|---|
| $0 < \mu < 1/(2^*\lambda_{max})$ | is overdamped |
| $\mu = 1/(2^*\lambda_{max})$ | is critically damped |
| $1/(2^*\lambda_{max}) < \mu < 1/\lambda_{max}$ | is underdamped |
| $\mu \leq 0$ or $\mu \geq 1/\lambda_{max}$ | is unstable |

For LMS, stability is maintained for $0<\mu<1/tr[R]$, where the trace of R ($tr[R]$) is the sum of the diagonal elements of R. For transversal filters, the stability region reduces to $0<\mu<1/((L+1)^*signal\ power)$.

The input correlation matrix, R, is a non-stationary parameter; that is, it changes with the data received, unless previously known. Therefore the adaptive coefficient will vary with time.

Methods of Detecting Divergence and Remedies

Divergence may be detected in a number of ways. In the situation of detecting divergence, the spatial position of the weights may be changed to a new location to "catch" a more stable convergence path. This relocation may be either to a randomly selected position, to a position from a preselected set of positions, or according to the current convergence path.

Divergence may be detected by the current spatial position or the convergence path. For example, if the weights begin to approach extremely improbable values (e.g., fall outside an expected range dependent on the nature of the system) the system may be diverging.

Divergence may also be detected if the k ratio is consistently registering large values.

The RAMS Algorithm

Figure 21:
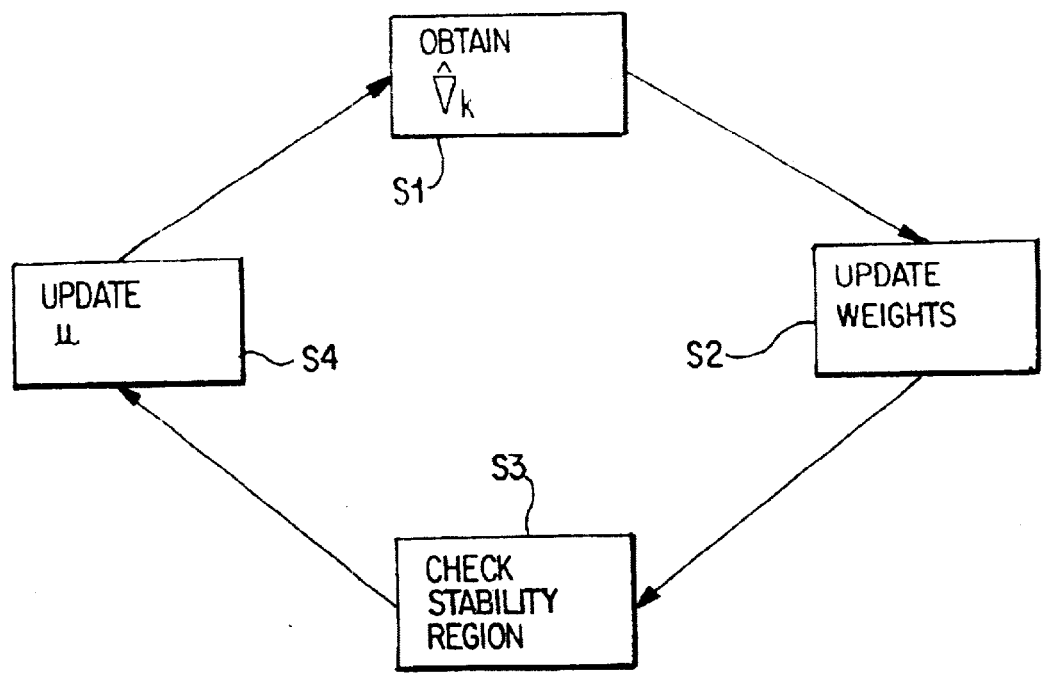
FIGS. 21–23 are flow charts which illustrate the operation of adaptive filtering systems according to the invention.
Figure 22:
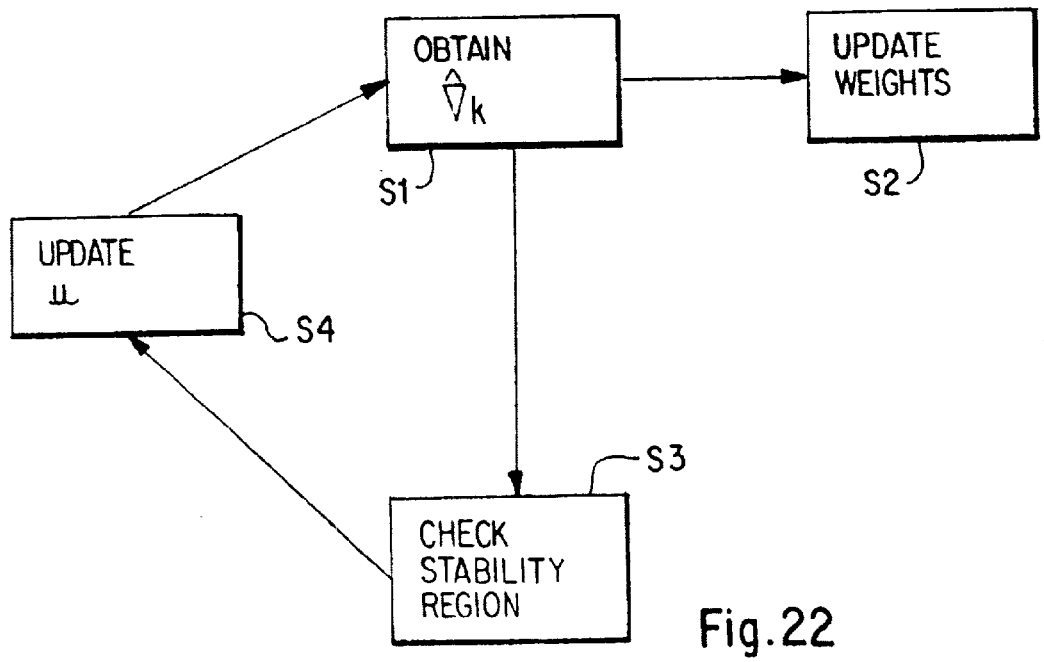
Figure 23:
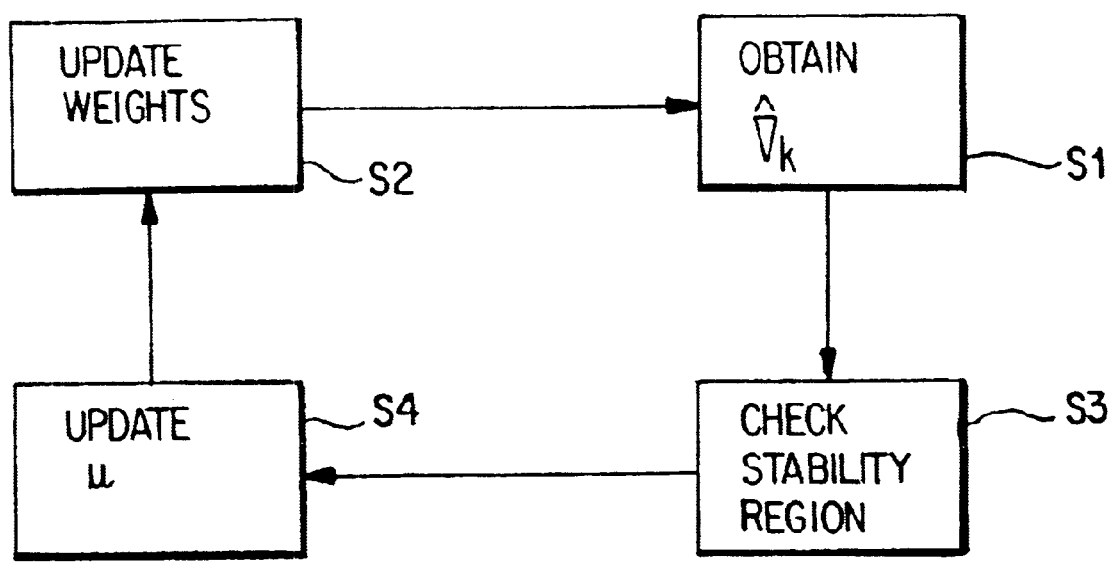

The individual features of the invention, including the RAMS algorithm, have been explained, and several alternative implementations have been described. FIGS. 21–23 are block diagrams which show an overview of examples of the RAMS algorithm. In each of these embodiments, the RAMS algorithm starts by determining $\nabla_k$ or an estimate of it (S1). This can be achieved by determining the error between the desired signal and the output signal. As noted previously, this gradient ($\nabla_k$) is used to update the weights (S2) according to the formula $W_{k+1}=W_k+\mu(-\nabla_k)$. In S3, the stability region is checked by examining the behavior of the weights as shown in FIG. 21, or by the changes to them or through the behavior of $\nabla$, its estimate, or its inputs as in FIGS. 22 and 23. The value of $\mu$ is updated in S4, based upon the determined stability of the system. The process is then repeated. It is apparent that these steps may be performed in any order, such as shown in FIGS. 22 and 23, for example.

The advancement that the RAMS algorithm provides is the checking of the stability of the system to provide a more educated selection of $\mu$. The choice of $\mu$ is more educated because it is based on the availability of more information.

PREFERRED EMBODIMENT

Figure 24:
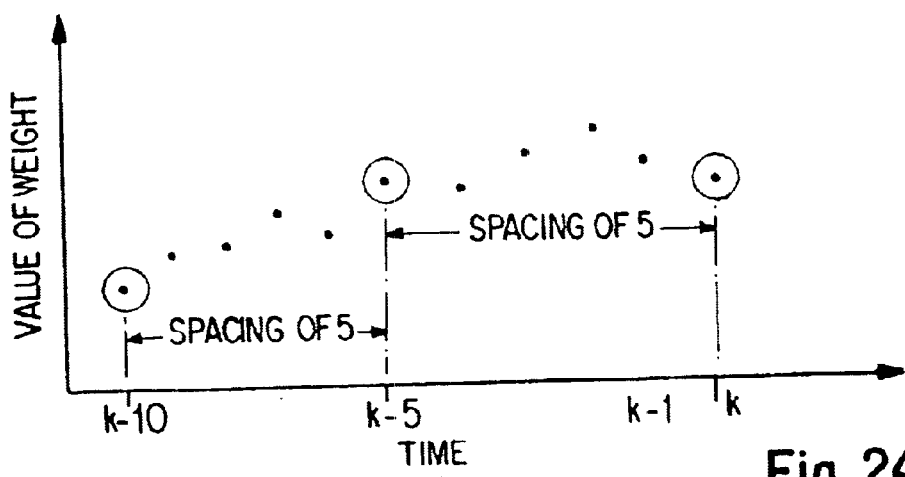
FIG. 24 is a graphic illustration of the details which require memory space for implementing the invention.

A preferred embodiment of the invention has three regions for the stability of the weights (unstable, stable, and constant), and classification is determined by three details in the curve with a spacing of five between points as shown in FIG. 24. Therefore, a memory for the weight path is needed for the current value and the previous ten values of the weights.

Figure 25:
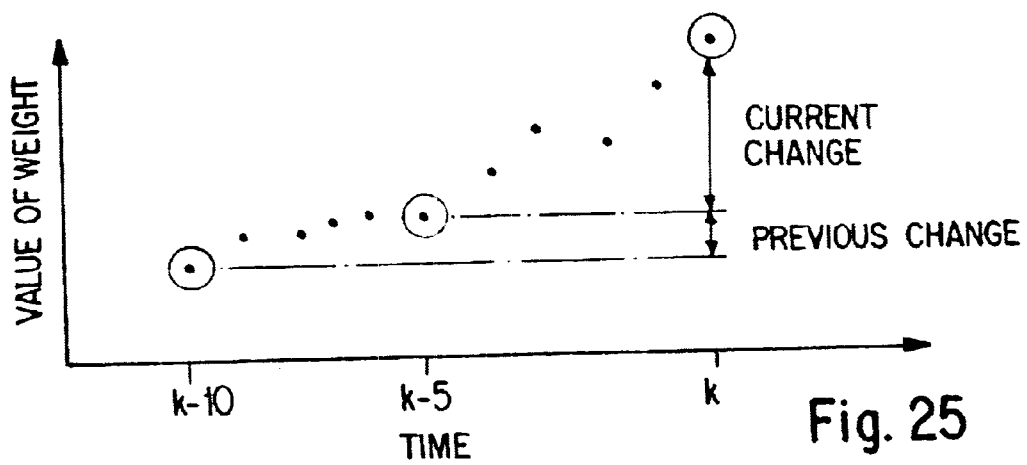
FIGS. 25 and 26 are graphic illustrations of unstable regions due to the magnitude of a change in step size and a change in direction, respectively.

An unstable region is determined to exist whenever the change in the weight during the current five steps is greater than 1.5 times the change which occurred during the previous five steps, as shown in FIG. 25.

Figure 26:
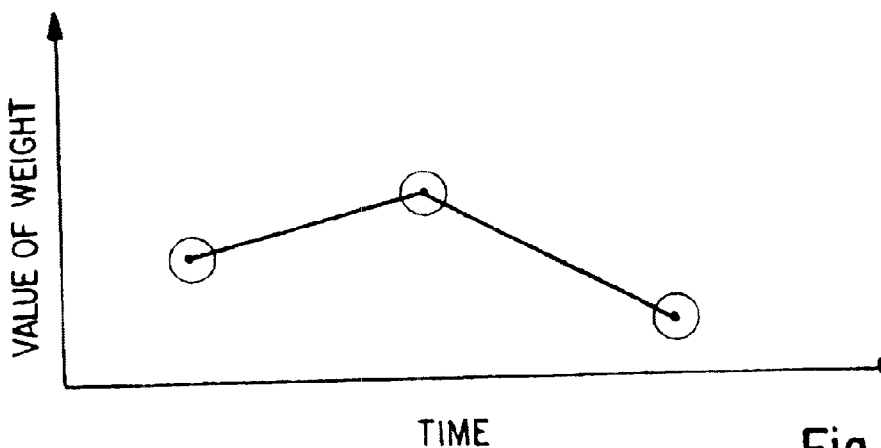

Also a reversal in the direction (by a value k or greater) of the change which occurred during the previous five steps relative to that of the current five steps would be considered unstable. For example, as shown in FIG. 26, an increase in the value of the weight is followed by a decrease in the value of the weight between details. This is considered to be a change in direction. This example is unstable for values of k=0 (a sign change) or k=−1 (a decrease by a greater amount than the increase in the previous step), for example. A decrease in the value of the weight followed by an increase in the value of the weight would also be considered as a change in direction.

Figure 27:
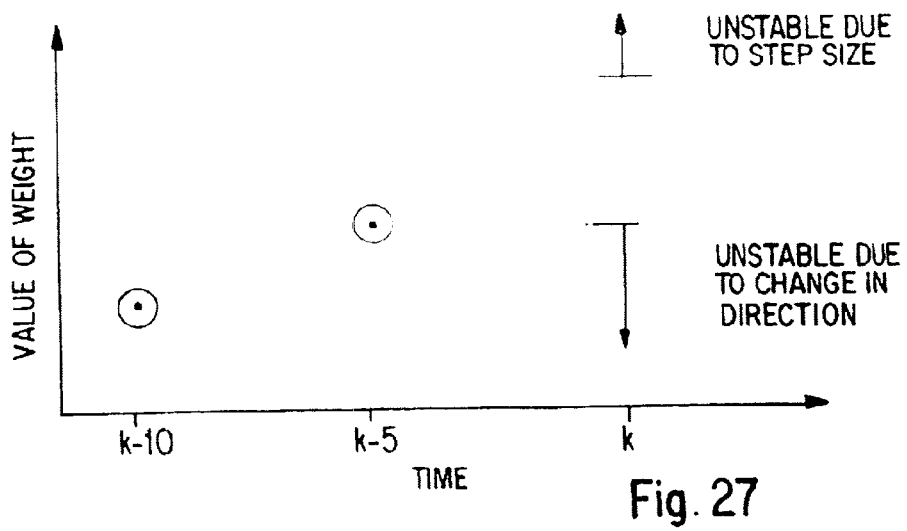
FIGS. 27–29 are graphic illustrations of a criterion for determining stability regions for the next detail location.

FIG. 27 depicts the unstable region for the next detail. That is, having the memory of the previous ten steps (spacing is in this example), the diagram illustrates those values of the current weight that would classify the system as unstable, i.e., for k>1.5 or k<0.

Figure 28:
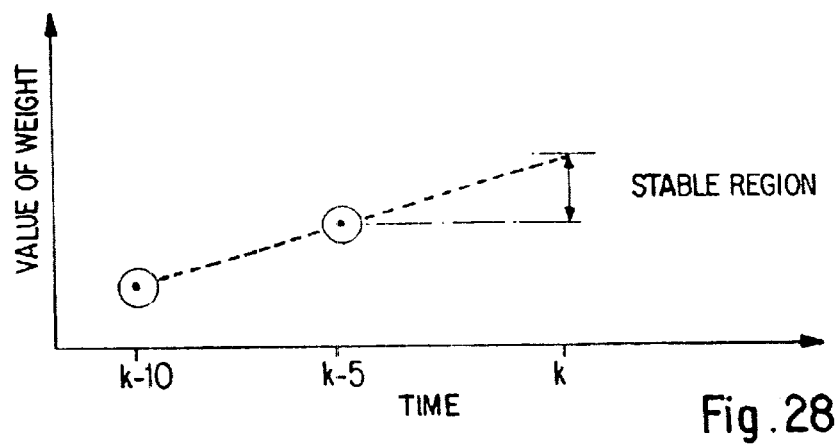

A stable region, is determined to exist on the other hand, when the change in the next detail relative to that of the previous detail is less than the change in the previous detail from the detail before it, and in the same direction; i.e., for 0<k<1, as illustrated in FIG. 28. Given the previous two details, the locations of the next detail that would classify the system as stable are shown.

Figure 29:
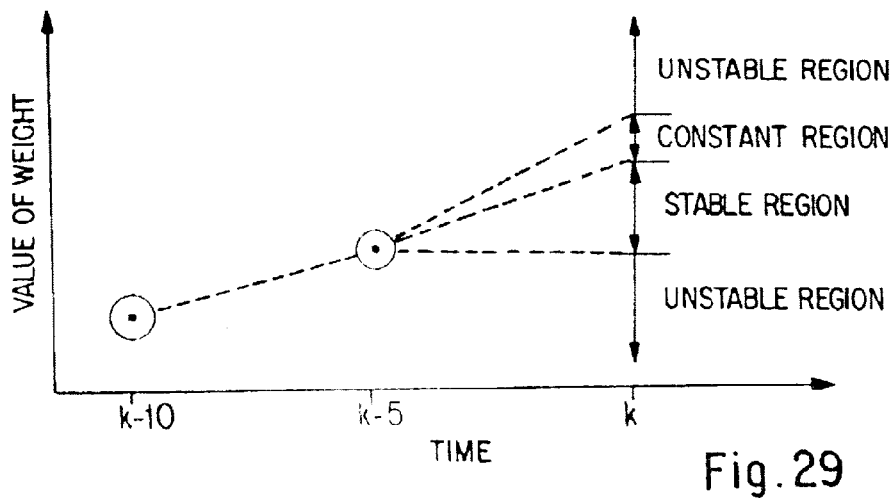

All details which do not fall within either the unstable region or the stable region are considered to be in the constant region. FIG. 29 illustrates the unstable region, the stable region, and the constant region. The previous two details are given, and the location of the next detail will fall into one of these regions and the system will be classified accordingly.

If the system is determined to be unstable, $\mu$ is multiplied by a factor 0.8. This will decrease the rate of convergence, but increase stability and decrease the residual error. On the other hand, if the system is determined to be stable, $\mu$ is multiplied by a factor 1.25 to increase the rate of convergence. Otherwise, the system is determined to be in the constant region and $\mu$ is left unchanged.

Figure 30:
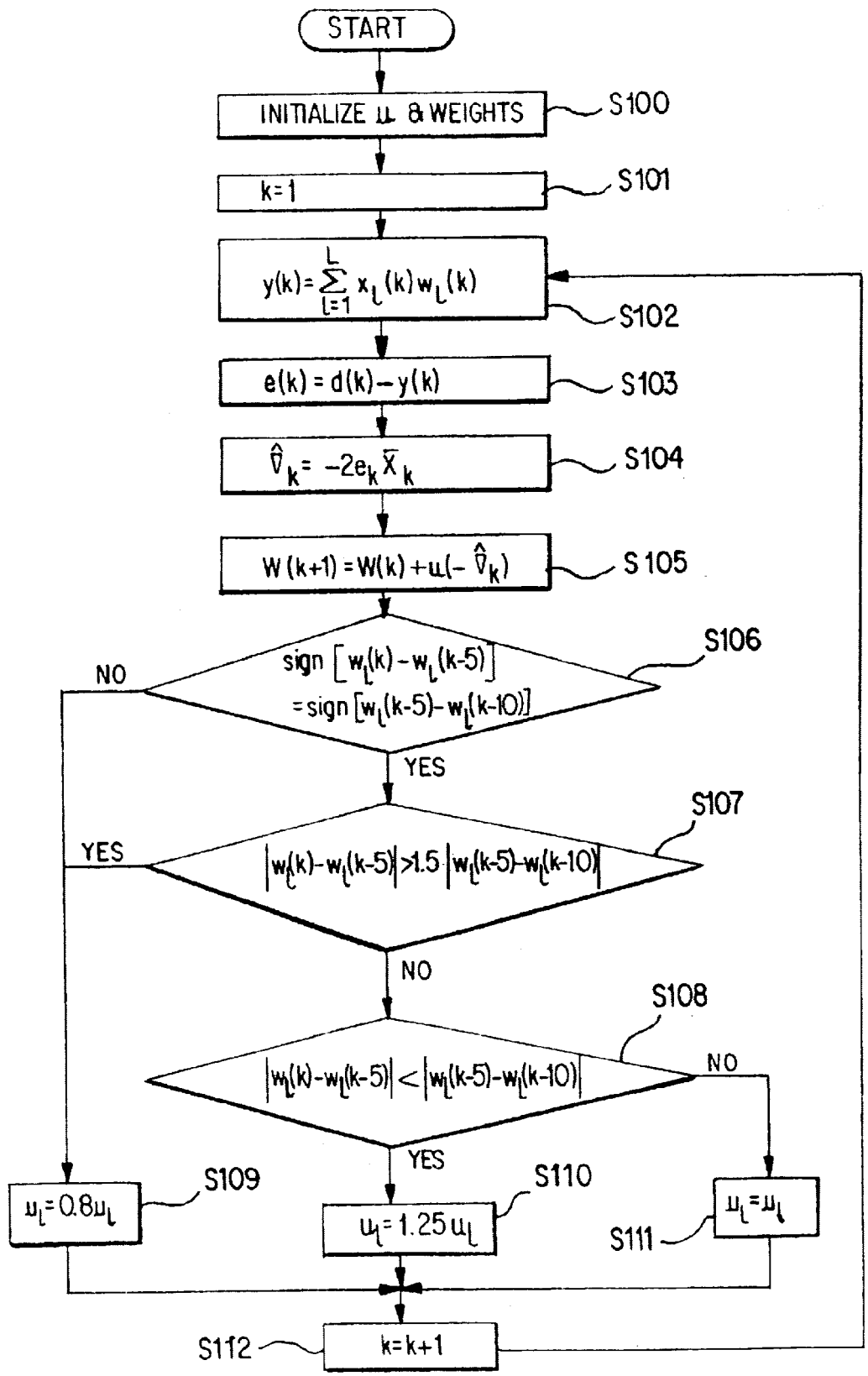
FIG. 30 is a flow chart which illustrates the operation of an embodiment of the invention following the route of one of the weights of the system.

The flow chart in FIG. 30 illustrates an application of the process of a preferred embodiment of the invention as an echo canceler, in which the stability of the system is checked and $\mu$ is updated correspondingly, depending on whether the system is determined to be unstable, stable, or constant.

In the first step (S100) the system is initialized, and the adaptive coefficient $\mu$ and the weights W are set to predetermined values. In S101, the time (iteration) index k is set to 1. In S102, the output of the adaptive filter y(k) is calculated as the summation of the values $x_1(k)^*w_1(k)$, and the error signal e(k) is determined as the difference between the desired response d(k) and the calculated filter output value y(k) (S103). In S104, an estimate of the gradient vector $\nabla_k$ is determined as $-2e_k\overline{X}_k$, and the weights w(k+1) for the next iteration are calculated (S105)

Thus far, the process depicted in FIG. 30 describes the functioning of a conventional adaptive filter or learning technique. In S106–S111, the process according to the invention for varying the values of $\mu$ to achieve more rapid and stable convergence of the system is implemented.

In S106 it is determined whether the sign of the incremental change $w_{1_0}(k)-w_{1_0}(k-5)$ is the same as that of the previous change $w_{1_0}(k-5)-w_{1_0}(k-10)$. If not (that is, the sign has changed), the value of $\mu$ is set at 0.8 time the previous value (S109), and k=k+1 in S112. If the sign remains unchanged, however, then a determination is made in S107 whether the magnitude of the most recent step exceeds that of the previous step by more than a factor of 1.5. If so, $\mu w_{1_0}$ is reduced by the factor 0.8 (S109) as previously described. If, however, the answer to the inquiry in S107 is negative, then the convergence of the system does not fall within the unstable range (FIG. 29) and a further inquiry is made in S108 whether the magnitude of the most recent step is less than that of the preceding step. If so, then the system convergence falls within the "stable" region and the value of $\mu_{1_0}$ is increased by a factor of 1.25 in S110.

Otherwise, the convergence falls within the "constant" range (FIG. 29), and the value of $\mu_{1_0}$ is unchanged in S111. The time index k is then incremented by 1 in S112, and the process is repeated.

Figure 31:
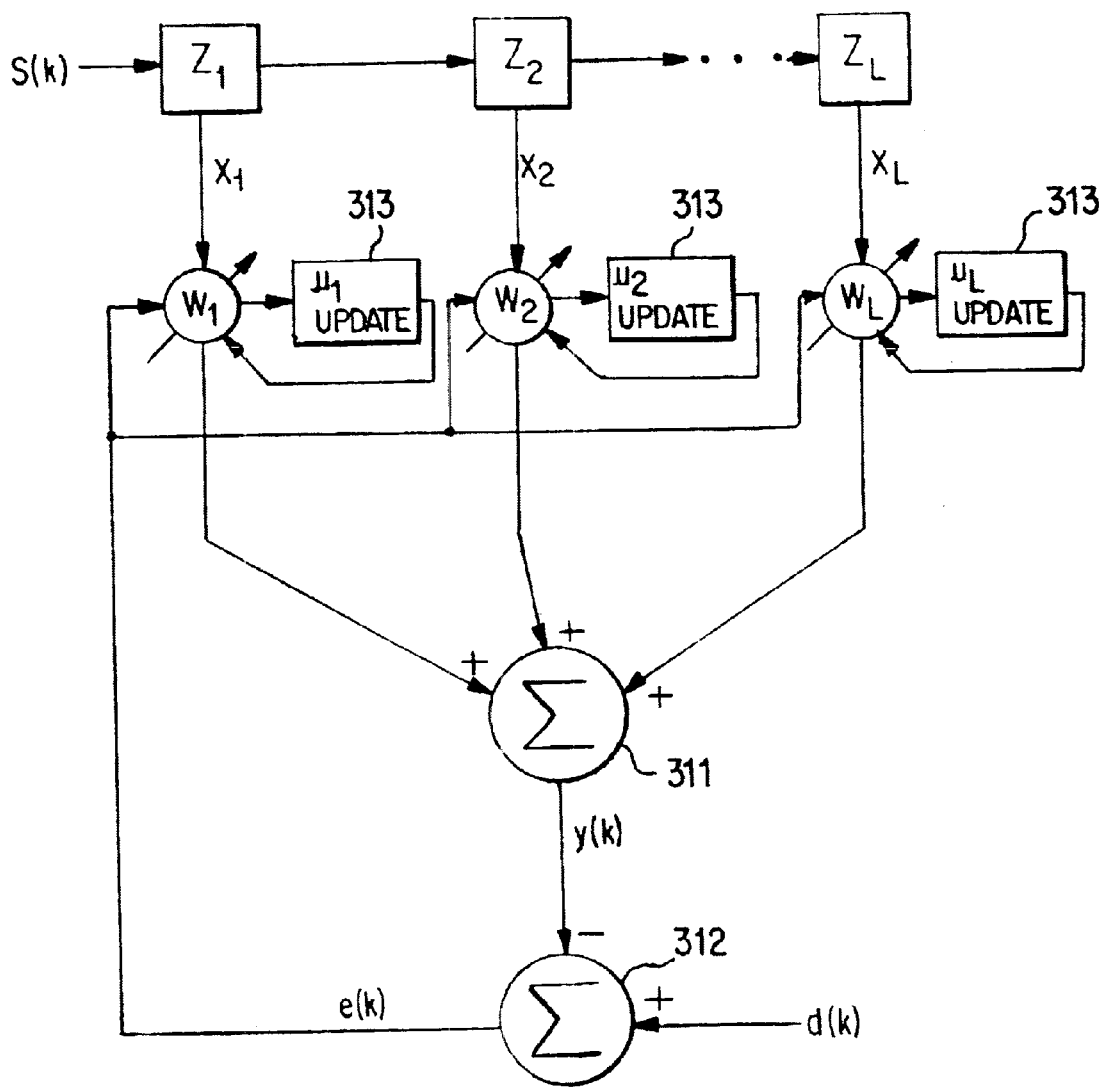
FIG. 31 is a diagram which shows an embodiment of the invention for a system having a plurality of weights.

FIG. 31 is a schematic depiction of an apparatus for performing the process of the flow chart in FIG. 30. The input signal s(k) is passed through delay elements to form $\bar{x}_k = x_1, x_2 \ldots x_L$. The signal $\bar{x}$ is then sent to the adaptive filter, where they go through weights $w_1, w_2 \ldots w_L$ and the result is added in a summation unit 311 to form the system output y(k). The error signal e(k) is formed in difference unit 312 and is fed back to each of the weighting units $w_1, w_2 \ldots w_L$ to modify the weight values accordingly. Variation of the values of $\mu$ as shown in S106–S111 of FIG. 30 is performed in the update elements 313.

Figure 32:
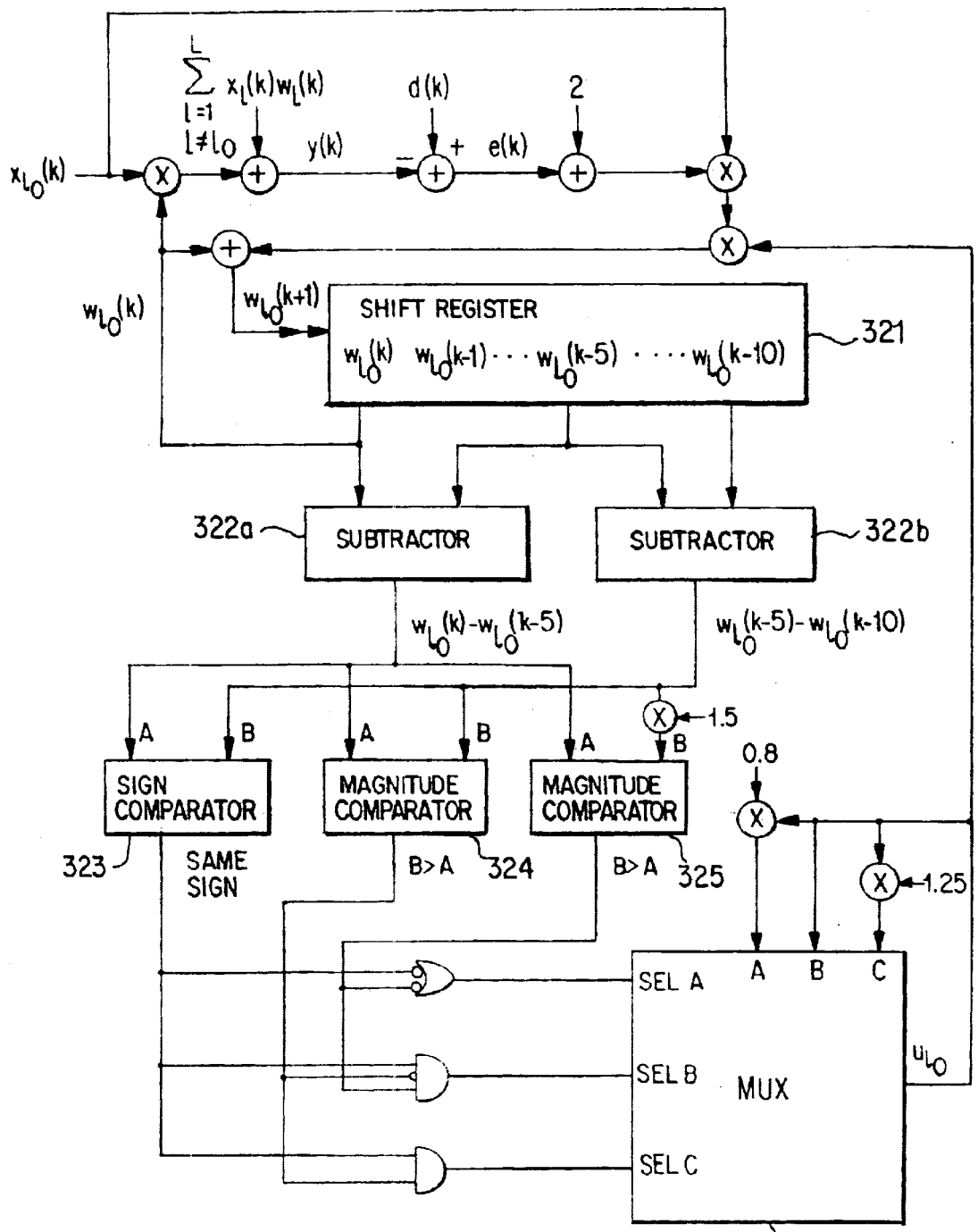
FIG. 32 is a schematic depiction of a first digital logic implementation of the embodiment in FIG. 30 of the invention for one of the weights of the system.

FIG. 32 is a schematic illustration of a digital logic implementation of an adaptive filtering system according to the invention, which implements the RAMS algorithm as described herein. (It should be noted that FIG. 32, an implementation of FIG. 30, shows the system for a single weight $w_{1_0}$; a similar configuration is applied for each of the weights $w_1 \ldots w_L$.) In the figure, the signal $\bar{x}$ is the input to the adaptive filter (the input to the $1_0^{th}$ weight is $x_{1_0}$). This signal is multiplied by the weight, $w_{1_0}$, and summed with all the other products of $x_1$ and their respective weights $w_1 \ldots w_L$, forming the value y. To determine the error, y is subtracted from the desired signal, d, and an approximation of the gradient, $\nabla$, is determined as $-2^*e^*\bar{X}$. For this particular weight, $w_{1_0}$, its portion of the gradient would be $-2^*e^*X_{1_0}W$ is then updated by $-\mu\nabla$, and the updated weight is fed into a shift register 321, so that the previous values of the weights are stored in memory.

The values of $w_{1_0}(k)-w_{1_0}(k-5)$ and $w_{1_0}(k-5)-w_{1_0}(k-10)$ are determined in difference units 322a and 322b, so that their magnitudes and sign are compared in comparator 323–325 to determine the stability of the system. If the signs are different (k<0), or if $|w_{1_0}(k)-w_{1_0}(k-5)|$ is greater than 1.5*$|w_{1_0}(k-5)-w_{1_0}(k-10)|$, then the system is determined to be in the unstable region and the corresponding $\mu$ is selected from the multiplexor 325, $\mu-0.8^*\mu_{1_0}$. If the system is not in the unstable region, then $|w_{1_0}(k)-w_{1_0}(k-5)|$ is compared to $|w_{1_0}(k-5)-w_{1_0}(k-10)|$ (comparator 324). If $|w_{1_0}(k)-w_{1_0}(k-5)|$ is less than $|w_{1_0}(k-5)-_{1_0}(k-10)|$ then the system is in the stable region and the multiplexor selects the $\mu_{1_0}$ which is increased by a factor 1.25. Otherwise, the system is determined to be in the constant region and the multiplexor selects the corresponding $\mu_{1_0}$, which has no change.

Figure 33:
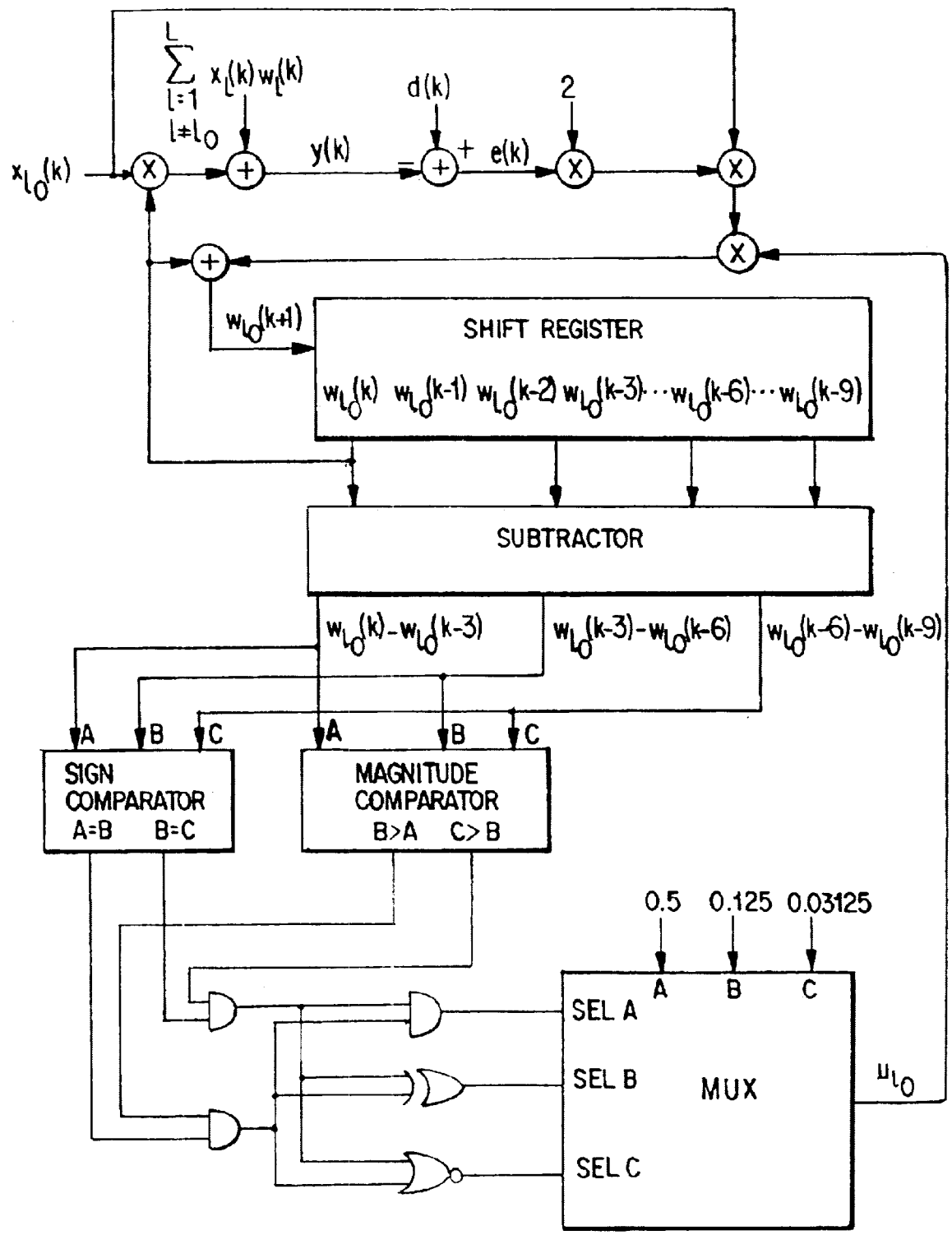
FIG. 33 is a schematic depiction of another digital logic implementation of the invention following the route of one of the weights of the system.

FIG. 33 shows another example of a digital logic implementation of the invention, which is similar to the digital logic implementation of FIG. 32, except that four details are used in the determination of stability, with a spacing of three. FIG. 33 follows the path of a single weight. The selection of the $\mu_{1_0}$ is chosen from three values (0.5, 0.125, 0.03125, all of which have a simple binary representations), based on the current stability status. As in FIG. 32, it is necessary to provide a corresponding arrangement for each weight.

Figure 34:
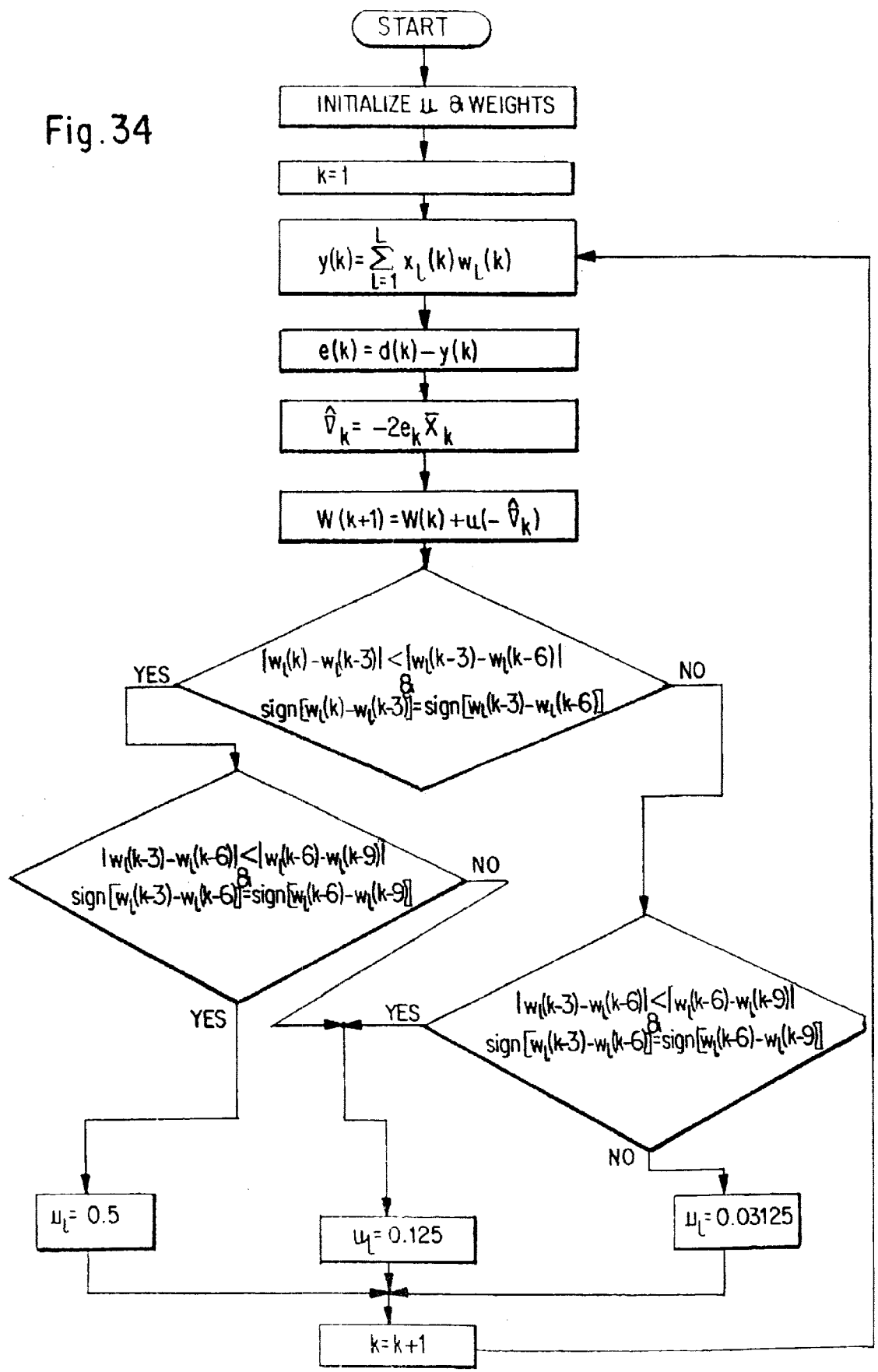
FIG. 34 is a flow chart which explains the process utilized in the embodiment of FIG. 33.

FIG. 34 is a flow chart which shows the process implemented in FIG. 33. In this figure, the logic behind the selection of $\mu$ is depicted in an easily determined fashion. The RAMS algorithm in this case goes through two decision regions and selects the corresponding $\mu$. (Although the flow chart depicts the two decisions occurring consecutively, in the digital logic implementation, both decision regions can be checked simultaneously.) The decision regions check whether the current step is stable relative to the previous step and whether the previous step is stable relative to the step preceding it. These stability checks are accomplished by comparing the vectors (magnitude and direction) of each step with its previous step. The selection of $\mu$ is as follows: If both the current and middle steps are classified as stable, then $\mu$ is 0.5; if only one of the steps is stable $\mu$ is 0.125; and if neither step is stable, $\mu$ is 0.03125.

Another method for the RAMS algorithm may incorporate a global $\mu$. In such an embodiment, each weight need not have its own $\mu$. The adaptive coefficient, $\mu$, can be updated by using the stability of each of the weights. This can be accomplished in the following fashion: Classify the stability of each of L weights, and determine the percentage of stable weights. This percentage of stable weights can then be used to update $\mu$. An example of a method of updating the adaptive coefficient for this case with five weights would incorporate the stability of each weight. This stability data of each weight may be put to use by any of the methods of updating $\mu$.

An example method of updating $\mu$ follows. If all five weights are stable, then increase $\mu$ by a factor of 2. If four weights are stable, then increase $\mu$ by 1.5. If three weights are stable, leave $\mu$ constant. If two weights are stable, multiply $\mu$ by a factor of 0.75. If only one weight is stable, multiply $\mu$ by a factor of 0.5. And if no weights are stable, then multiply $\mu$ by a factor of 0.25. Of course in this example the factors can be changed, and so can the method of determining the stability of each weight. But this example illustrates that the RAMS algorithm can use a global adaptive coefficient.

Figure 35:
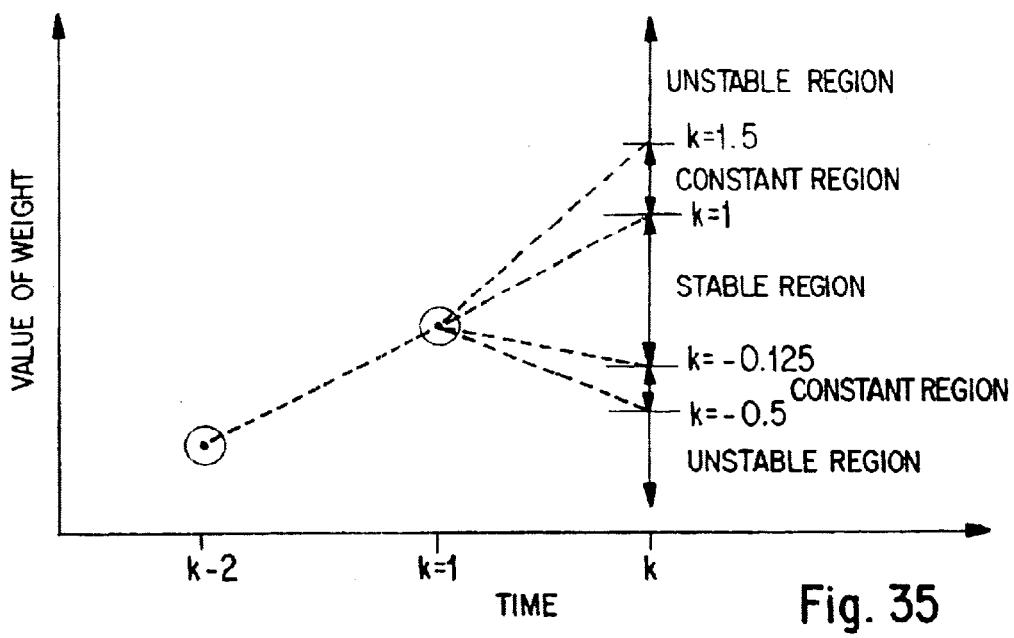
FIGS. 35 and 36 are illustrations of the stability region for another embodiment.
Figure 36:
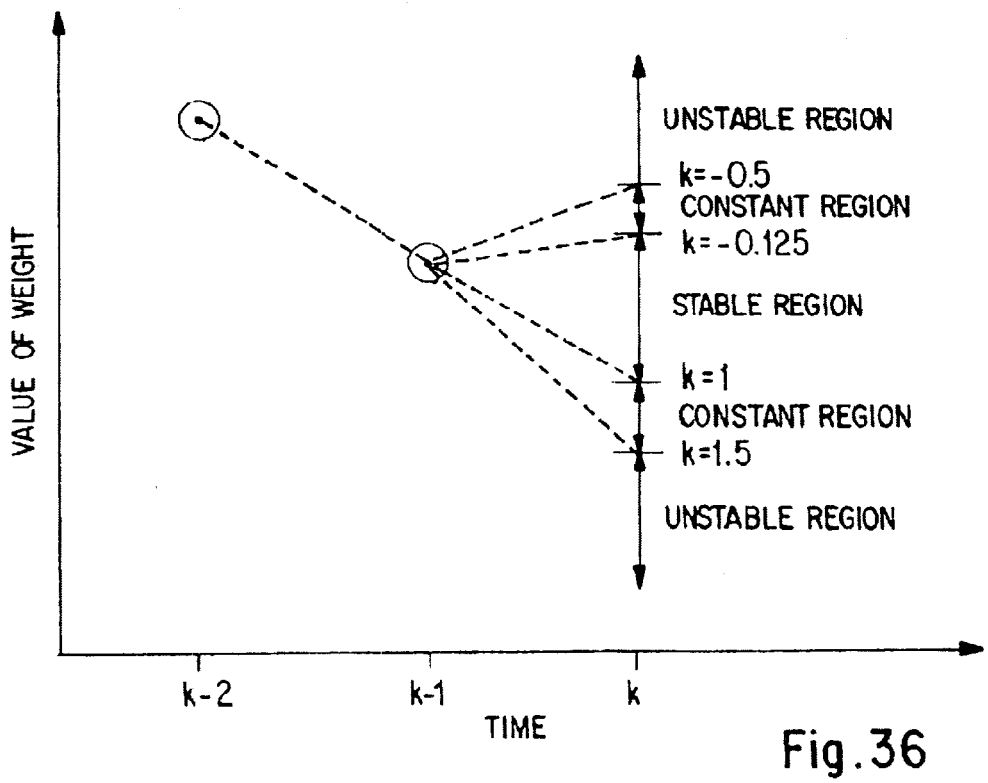

Another example of a digital logic implementation incorporates different regions for stability as shown in FIGS. 35 and 36. FIG. 35 is a graphical description of the regions of stability with respect to k. FIG. 36 is identical to FIG. 35, except that the step between the first two details is in the negative direction. Therefore, FIG. 36 shows that all the properties of the stability regions are identical to those of FIG. 35.

Figure 37:
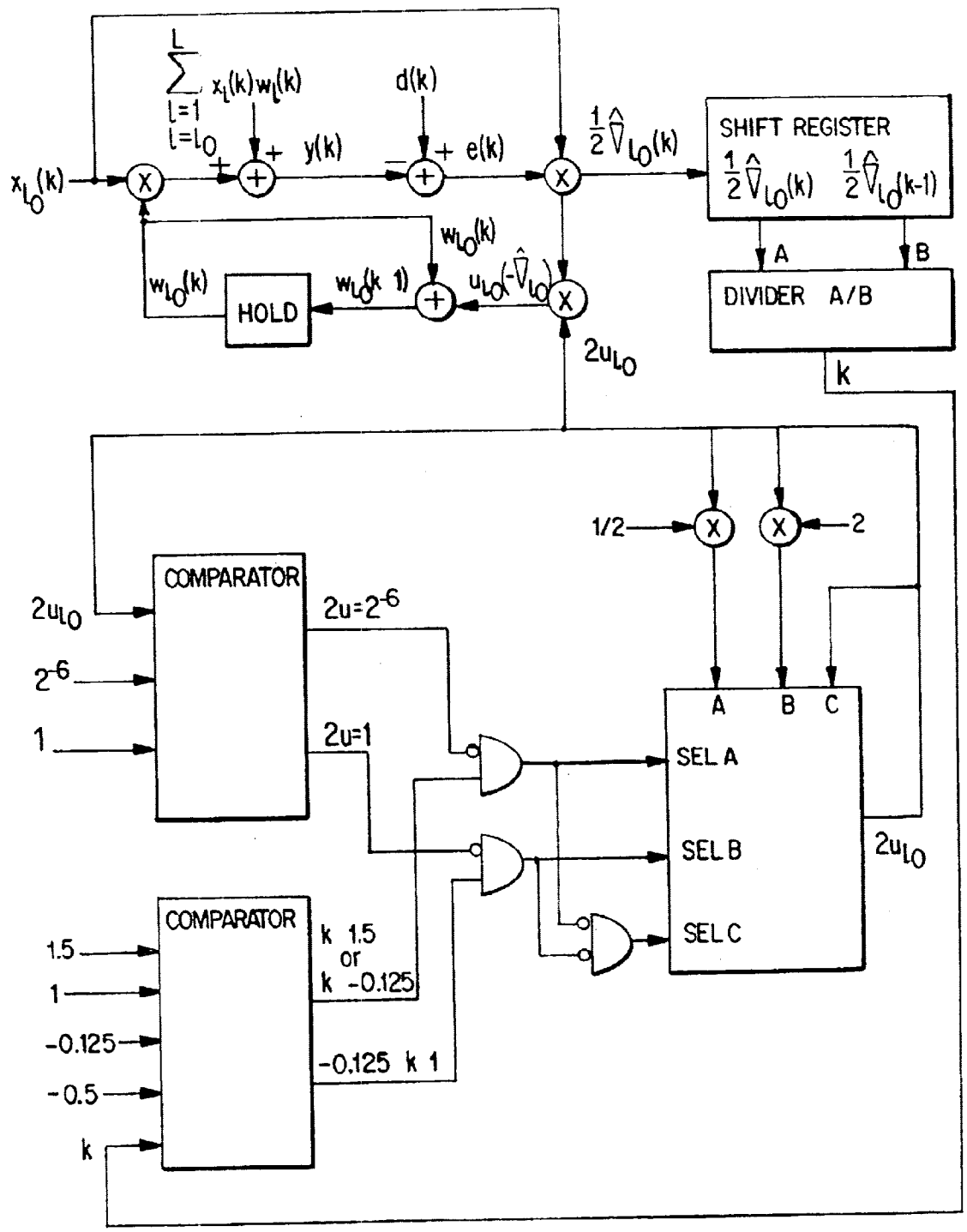
FIG. 37 is a digital logic implementation of FIGS. 35 and 36 following the route of one of the weights of the system.

FIG. 37, which follows the path for a single weight, is a digital logic implementation for the stability regions depicted in FIGS. 35 and 36. This implementation of the RAMS algorithm uses 3 details and the adaptive coefficient has a minimum value of 0.0078125, or equivalently $2^{-7}$, and a maximum value of ½, or equivalently $2^{-1}$. The spacing for this example is one (i.e., the step sizes that are compared are for adjacent iterations). Two variations are accounted for in the comparison of the step sizes. The first variation is that the step sizes are input into the shift register directly for comparison by the RAMS algorithm, rather than a comparison of the actual weight values. The second variation is that the adaptive coefficient is not incorporated into the comparison (therefore, the comparison is of the estimate of the gradient). However, the factor of 2 is not incorporated in the gradient; rather, it is bunched with the adaptive coefficient. So, in equation form, this is saying that the general equation is $W_{k+1}=W_k+\mu(-\nabla)=W_k+\mu(2e\bar{X})=W_k+(2\mu)$ $(\bar{X})$. Reiterating, the RAMS algorithm, in this example, compares $e\bar{X}$ instead of the estimate of $\nabla$. Since the output of the multiplexer is $2\mu$, the range of $2\mu$ is $2^{-6}$ to 1. Note that for all figures the multiplexer is loosely used as a selector, i.e., if selA is HIGH (a 1 in digital logic) then the value of A is chosen as the output.

The method of preferred embodiment described here is simple, requiring little in the way of complexity or cost, and greatly enhances the performance of the system. The factors, values of variables, and number of regions can all be changed to improve performance or decrease cost. For example, one alternative method would include using factors of 2 for increasing and decreasing $\mu$. These alternatives increase the simplicity of the hardware because multiplying and dividing by a factor of 2 is very simply in binary systems. Also note that W may include feedback weights the input to the weight would be the feedback).

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of operating an adaptive system having a variable transfer function that is determined by at least one weight which is periodically adjustable in determinable increments, as a function of a weight increment signal including an adaptive coefficient $\mu$, whereby said adaptive system converges to conform a processed output to a desired system output, said method comprising:

recording historical measures of one of said increments, and quantities which are inputs that affect values of said increments;

based on said historical measures, determining a degree of stability with which said adaptive system converges to achieve said desired system output; and varying said adaptive coefficient as a function of said determined degree of stability.

2. The method of operating an adaptive system according to claim 1, wherein said step of determining a degree of stability comprises determining a stability level as a function of at least one of values of said historical measures;

whether consecutive historical measures are increasing in value;

whether consecutive historical measures are decreasing in value;

a percentage of said historical measures which show an increase in value relative to a preceding value; and a ratio between values of consecutive historical measures.

3. The method of operating an adaptive system according to claim 2, wherein the quantity "values of said historical measures" includes at least one of:

an average of values of a preset number of next preceding historical measures;

a median of values of a preset number of next preceding historical measures;

a total of the values of said preset number of historical measures;

whether any of said preset number of said historical measures has a value that exceeds a predetermined threshold; and a percentage of said preset number of historical measures that have values that exceed said predetermined threshold.

4. The method of operating an adaptive system according to claim 1, wherein said step of varying said adaptive coefficient comprises one of:

incrementing said adaptive coefficient by at least one predetermined amount depending on said determined degree of stability;

multiplying said adaptive coefficient by a factor greater than 1.0 to increase it, and by a factor less than 1.0 to decrease it, said factor depending on said determined degree of stability;

incrementing said adaptive coefficient by a variable amount which is a function of said determined degree of stability;

providing a predetermined set of adaptive coefficients from which an adaptive coefficient is selected directly, based upon said determined degree of stability; and providing a predetermined set of possible adaptive coefficients at different levels, and increasing or decreasing a previous adaptive coefficient as between levels during a single iteration, as a function of said determined degree of stability.

5. The method according to claim 4, wherein a value of individual changes of said adaptive coefficient is limited by minimum and maximum values.

6. The method according to claim 4, wherein a value of said adaptive coefficient is limited by minimum and maximum values.

7. The method of operating an adaptive system according to claim 4, wherein said predetermined amount for a next increase or decrease is enlarged when a predetermined portion of preceding historical measures have exhibited a change in the same direction as said next increase.

8. The method according to claim 1, wherein said step of varying said adaptive coefficient comprises:

determining an input correlation matrix R, according to $$R=E[\bar{x}_k * \bar{x}_k^t]$$

where $\bar{x}_k=[x_1, x_2, \ldots x_L]$;

determining or estimating eigenvalues $\lambda$ of R; and selecting a value for the adaptive coefficient as a function of $\lambda$.

9. The method according to claim 1, wherein said step of determining a degree of stability comprises:

based on said recorded historical measures, establishing stability ranges for characterizing stability of convergence of said adaptive system dependent upon a value of a next occurring measure weight;

comparing the value of said next occurring weight with said established ranges; and determining a degree of stability as a function of said comparison.

10. The method according to claim 9, wherein each of said stability ranges has a preselected adaptive coefficient associated therewith.

11. The method according to claim 1, wherein a determination is made that the adaptive system is diverging when one of the following is true:

the weights approach highly improbable values; and a ratio k of consecutive weight values consistently exceeds a predetermined threshold.

12. The method according to claim 11, wherein when divergence of the system is detected, spatial positions of the weights are modified to achieve a more stable convergence path.

13. A method for adaptive processing of an input signal according to a variable transfer function that is determined by at least one weight value, said method comprising:
processing an input signal according to said transfer function to generate a processed output signal;
comparing said processed output signal to a desired output, and generating a weight increment signal as a function of (i) a difference between said processed output signal and said desired output, and (ii) an adaptive coefficient;
periodically modifying said weight value in increments as a function of said weight increment signal whereby said processed output converges to said desired output over time;
recording historical measures of one of said increments, and quantities which are inputs that affect values of said increments;
based on said historical measures, determining a degree of stability with which said processed output signal converges to a desired output; and
varying said adaptive coefficient as a function of said determined degree of stability.

14. The method according to claim 13, wherein said step of determining a degree of stability comprises determining a degree of stability as a function of at least one of
values of said historical measures;
whether consecutive historical measures are increasing in value;
whether consecutive historical levels are decreasing in value;
a percentage of said historical measures which show an increase in value relative to a preceding value; and
a ratio between values of consecutive historical measures.

15. The method according to claim 14, wherein the quantity "values of said historical measures" includes at least one of:
an average of values of a preset number of next preceding historical measures;
a median of values of a preset number of next preceding historical measures;
a total of the values of said preset number of historical measures;
whether any of said preset number of said historical measures has a value that exceeds a predetermined threshold; and
a percentage of said preset number of historical measures that have values that exceed said predetermined threshold.

16. The method according to claim 13, wherein said step of varying said adaptive coefficient comprises one of:
increasing or decreasing said adaptive coefficient by at least one predetermined amount depending on said determined degree of stability;
multiplying said adaptive coefficient by a factor greater than 1.0 to increase it, and by a factor less than 1.0 to decrease it, said factor depending on said determined degree of stability;
incrementing said adaptive coefficient by a variable amount which is a function of said determined degree of stability;
providing a predetermined set of adaptive coefficients from which an adaptive coefficient is selected directly, based upon said determined degree of stability; and
providing a predetermined set of possible adaptive coefficients at different levels, and increasing or decreasing a previous adaptive coefficient by one level during a single iteration, as a function of said determined degree of stability.

17. The method according to claim wherein values of individual changes of said adaptive coefficient is limited by minimum and maximum values.

18. The method according to claim 12, wherein a value of said adaptive coefficient is limited by minimum and maximum values.

19. The method according to claim 16, wherein said predetermined amount for a next increase or decrease is enlarged when a predetermined portion of preceding historical measures have exhibited a change in the same direction as said next increase.

20. The method according to claim 13, wherein said step of varying said adaptive coefficient comprises:
determining an input correlation matrix R, according to $$R = E[\bar{x}_k * \bar{x}_k^t]$$

where $\bar{x}_k[x_1, x_2, \ldots x_L]$;
determining or estimating eigenvalues $\lambda$ of R; and
selecting a value for the adaptive coefficient as a function of $\lambda$.

21. The method according to claim 13, wherein said step of determining a degree of stability comprises:
based on said recorded historical measures, establishing stability ranges for characterizing stability of convergence of said adaptive system dependent upon a value of a next occurring weight;
comparing the value of said next occurring weight with said established ranges; and
determining a degree of stability as a function of said comparison.

22. The method according to claim 21, wherein each of said stability ranges has a preselected adaptive coefficient associated therewith.

23. The method according to claim 13, wherein a determination is made that the processed output is diverging when one of the following is true:
the weights approach highly improbable values; and
a ratio k of consecutive weight values consistently exceeds a predetermined threshold.

24. The method according to claim 23, wherein when divergence of the system is detected, spatial positions of the weights are modified to achieve a more stable convergence path.

25. An adaptive system, comprising:
means for processing an input signal to generate a processed output signal according to a variable transfer function that is determined by at least one weight value;
a comparator which compares said processed output with a desired system output and generates a difference value based on said comparison;
means for generating a weight increment signal as a function of said difference value and of a variable adaptive coefficient;
means for periodically adjusting said weight value by determinable increments based on said weight increment signal, whereby said processed output converges to said desired system output;

means for recording historical measures of said increments;

means for determining a degree of stability with which an output of said system converges to a desired output based on said recorded historical measures; and means for varying said adaptive coefficient as a function of said determined degree of stability.

26. The apparatus according to claim 25, wherein said means for determining a degree of stability:

establishes, based on said recorded historical measures, stability ranges for characterizing stability of convergence of said adaptive system dependent upon a value of a next occurring weight;

compares the value of said next occurring weight with said established ranges; and determines a degree of stability as a function of said comparison.

27. The apparatus according to claim 26, wherein each of said stability ranges has a preselected adaptive coefficient associated therewith.

28. The method according to claim 28, wherein a determination is made that the adaptive system is diverging when one of the following is true:

the weights approach highly improbable values; and a ratio k of consecutive weight values consistently exceeds a predetermined threshold.

29. The method according to claim 28, wherein when divergence of the system is detected, spatial positions of the weights are modified to achieve a more stable convergence path.

30. A method of operating an adaptive system having a variable transfer function that is determined by at least one weight which is periodically adjustable in determinable increments, as a function of a weight increment signal including an adaptive coefficient $\mu$ whereby said adaptive system converges to conform a processed output of said system to a desired system output, said method comprising:

recording historical measures of one of said increments, and quantities which are inputs that affect values of said increments;

classifying convergence of said adaptive system as one of unstable, constant, and stable as a function of said historical measures;

selecting a value for said adaptive coefficient associated with a classification of said convergence;

modifying said adaptive coefficient $\mu$ to conform to said selected value.

31. The method according to claim 30, wherein said step of classifying convergence of said adaptive system is performed on the basis of at least one of values of said historical measures;

whether consecutive historical measures are increasing in value;

whether consecutive historical measures are decreasing in value;

a percentage of said historical measures which show an increase in value relative to a preceding measure; and a ratio between values of consecutive historical measures.

32. The method according to claim 31, wherein the quantity "values of said historical measures" includes at least one of:

an average of values of a preset number of next preceding historical measures;

a median of values of a preset number of next preceding historical measures;

a total of the values of said preset number of historical measures;

whether any of said preset number of said historical measures has a value that exceeds a predetermined threshold; and a percentage of said preset number of historical measures that have values that exceed said predetermined threshold.

33. The method according to claim 30, wherein said step of modifying said adaptive coefficient is performed only when said step of classifying convergence yields the same result for a predetermined number of consecutive iterations.

34. A system comprising:

a programmable information processing unit having an input and an output; and a storage medium readable by said information processor, and encoded with a program for causing said information processor to perform the following steps processing an input signal received at said input to generate a corresponding processed output signal at said output, according to a variable transfer function that is determined by at least one weight value;

comparing said processed output signal to a desired output, and generating a weight increment signal as a function of (i) a difference between said processed output signal and said desired output, and (ii) an adaptive coefficient;

periodically modifying said weight value in increments as a function of said weight increment signal whereby said processed output converges to said desired output over time;

recording historical measures of one of said increments, and quantities which are inputs that affect values of said increments;

based on said recorded historical measures, determining a degree of stability with which said processed output converges to said desired output; and varying said adaptive coefficient as a function of said determined degree of stability.

35. The system according to claim 34, wherein said step of determining a degree of stability comprises determining said degree of stability as a function of at least one of values of said historical measures;

whether consecutive historical measures are increasing in value;

whether consecutive historical measures are decreasing in value;

a percentage of said historical measures which show an increase in value relative to a preceding measure; and a ratio between values of consecutive historical measures.

36. The system according to claim 35, wherein the quantity "values of said historical measures" includes at least one of:

an average of values of a preset number of next preceding historical measures;

a median of values of a preset number of next preceding historical measures;

a total of the values of said preset number of historical measures;

whether any of a preset number of said historical measures has a value that exceeds a predetermined threshold; and a percentage of said preset number of historical measures that have values that exceed said predetermined threshold.

37. The system according to claim 34, wherein said step of varying said adaptive coefficient comprises one of:

increasing or decreasing said adaptive coefficient by at least one predetermined amount, or leaving it unchanged, depending on said determined degree of stability;

multiplying said adaptive coefficient by a factor greater than 1.0 to increase it, and by a factor less than 1.0 to decrease it, said factor depending on said determined degree of stability;

incrementing said adaptive coefficient by a variable amount which is a function of said determined degree of stability;

providing a predetermined set of adaptive coefficients from which an adaptive coefficient is selected directly, based upon said determined degree of stability; and providing a predetermined set of possible adaptive coefficients at different levels, and increasing or decreasing a previous adaptive coefficient as between levels during a single iteration or leaving it unchanged, as a function of said determined security level.

38. The system according to claim 37, wherein a value of individual changes of said adaptive coefficient is limited by minimum and maximum values.

39. The system according to claim 37, wherein a value of said adaptive coefficient is limited by minimum and maximum values.

40. The system according to claim 37, wherein said predetermined amount for a next increase or decrease is enlarged when a predetermined portion of preceding historical measures have exhibited a change in the same direction as said next increase.

41. The system according to claim 34, wherein said step of varying said adaptive coefficient comprises:

determining an input correlation matrix R, according to $$R = E[\bar{x}_k{}^* \bar{x}_k{}^t]$$

where $\bar{x}_k = [x_1, x_2, \ldots x_L]$;

determining or estimating eigenvalues $\lambda$ of R; and selecting a value for the adaptive coefficient as a function of $\lambda$.

42. A computer readable medium encoded with a computer program for causing a digital computer to perform the following steps:

processing an input signal received by said computer to generate a corresponding processed output signal, according to a variable transfer function that is determined by at least one weight value;

comparing said processed output signal to a desired output, and generating a weight increment signal as a function of (i) a difference between said processed output signal and said desired output, and (ii) an adaptive coefficient;

periodically modifying said weight value in increments as a function of said weight increment signal whereby said processed output converges to said desired output over time;

recording historical measures of one of said increments, and quantities which are inputs that affect values of said increments;

based on said recorded historical measures, determining a degree of stability with which said processed output converges to said desired output; and varying said adaptive coefficient as a function of said determined degree of stability.

43. The computer readable medium according to claim 42, wherein said step of determining a degree of stability comprises determining said degree of stability as a function of at least one of:

values of said historical measures;

whether consecutive historical measures are increasing in value;

whether consecutive historical measures are decreasing in value;

a percentage of said historical measures which show an increase in value relative to a preceding measure; and a ratio between values of consecutive historical measures.

44. The computer readable medium according to claim 43, wherein the quantity "values of said historical measures" includes at least one of:

an average of values of a preset number of next preceding historical measures;

a median of values of a preset number of next preceding historical measures;

a total of the values of said preset number of historical measures;

whether any of a preset number of said historical measures has a value that exceeds a predetermined threshold; and a percentage of said preset number of historical measures that have values that exceed said predetermined threshold.

45. The computer readable medium according to claim 42, wherein said step of varying said adaptive coefficient comprises one of:

increasing or decreasing said adaptive coefficient by at least one predetermined amount depending on said determined degree of stability;

multiplying said adaptive coefficient by a factor greater than 1.0 to increase it, and by a factor less than 1.0 to decrease it, said factor depending on said determined degree of stability;

incrementing said adaptive coefficient by a variable amount which is a function of said determined degree of stability;

providing a predetermined set of adaptive coefficients from which an adaptive coefficient is selected directly, based upon said determined degree of stability; and providing a predetermined set of possible adaptive coefficients at different levels, and increasing or decreasing a previous adaptive coefficient as between levels during a single iteration, or leaving it unchanged, as a function of said determined security level.

46. The computer readable medium according to claim 45, wherein a value of individual changes of said adaptive coefficient is limited by minimum and maximum values.

47. The computer readable medium according to claim 45, wherein a value of said adaptive coefficient is limited by minimum and maximum values.

48. The computer readable medium according to claim 42, wherein said step of varying said adaptive coefficient comprises:

determining an input correlation matrix R, according to $$R = E[\bar{x}_k{}^* \bar{x}_k{}^t]$$

where $\bar{x}k = [x_1, x_2, \ldots x_L]$;

determining or estimating eigenvalues $\lambda$ of R; and selecting a value for the adaptive coefficient as a function of $\lambda$.

49. The computer readable medium according to claim 45, wherein said predetermined amount for a next increase or decrease is enlarged when a predetermined portion of preceding historical measures have exhibited a change in the same direction as said next increase.

* * * * *